US010714337B2

(12) United States Patent
Kim et al.

(10) Patent No.: US 10,714,337 B2
(45) Date of Patent: Jul. 14, 2020

(54) PROCESS FOR GROWING NANOWIRES OR NANOPYRAMIDS ON GRAPHITIC SUBSTRATES

(71) Applicants: CRAYONANO AS, Trondheim (NO); NORWEGIAN UNIVERSITY OF SCIENCE AND TECHNOLOGY (NTNU), Trondheim (NO)

(72) Inventors: Dong Chul Kim, Trondheim (NO); Ida Marie Høiaas, Trondheim (NO); Mazid Munshi, Trondheim (NO); Bjørn Ove Fimland, Trondheim (NO); Helge Weman, Ecublens (CH); Dingding Ren, Trondheim (NO); Dasa Dheeraj, Trondheim (NO)

(73) Assignees: CRAYONANO AS, Trondheim (NO); NORWEGIAN UNIVERSITY OF SCIENCE AND TECHNOLOGY (NTNU), Trondheim (NO)

( * ) Notice: Subject to any disclaimer, the term of this patent is extended or adjusted under 35 U.S.C. 154(b) by 0 days.

(21) Appl. No.: 15/749,228

(22) PCT Filed: Aug. 1, 2016

(86) PCT No.: PCT/EP2016/068350
§ 371 (c)(1),
(2) Date: Jan. 31, 2018

(87) PCT Pub. No.: WO2017/021380
PCT Pub. Date: Feb. 9, 2017

(65) Prior Publication Data
US 2018/0226242 A1 Aug. 9, 2018

(30) Foreign Application Priority Data

Jul. 31, 2015 (GB) .................................. 1513567.6
Jan. 5, 2016 (GB) .................................. 1600162.0

(51) Int. Cl.
H01L 21/02 (2006.01)

(52) U.S. Cl.
CPC ...... *H01L 21/0262* (2013.01); *H01L 21/0254* (2013.01); *H01L 21/02376* (2013.01);
(Continued)

(58) Field of Classification Search
CPC ............. H01L 29/785; H01L 29/66015; H01L 29/0669; H01L 21/02376; H01L 21/0254
See application file for complete search history.

(56) References Cited

U.S. PATENT DOCUMENTS

| 4,213,801 A | 7/1980 | Johnston |
| 7,335,908 B2 | 2/2008 | Samuelson et al. |

(Continued)

FOREIGN PATENT DOCUMENTS

| CN | 101504961 A | 8/2009 |
| CN | 101710567 A | 5/2010 |

(Continued)

OTHER PUBLICATIONS

Non-Final Office Action dated Jul. 5, 2018 in related U.S. Appl. No. 15/744,457.
(Continued)

*Primary Examiner* — Hsien Ming Lee
(74) *Attorney, Agent, or Firm* — Meunier Carlin & Curfman LLC

(57) ABSTRACT

A process for growing nanowires or nanopyramids comprising: (I) providing a graphitic substrate and depositing AlGaN, InGaN, AlN or AlGa(In)N on said graphitic substrate at an elevated temperature to form a buffer layer or nanoscale nucleation islands of said compounds; (II) growing a plurality of semiconducting group III-V nanowires or nanopyramids, preferably III-nitride nanowires or nanopy-
(Continued)

ramids, on the said buffer layer or nucleation islands on the graphitic substrate, preferably via MOVPE or MBE.

33 Claims, 7 Drawing Sheets

(52) U.S. Cl.
CPC .. *H01L 21/02458* (2013.01); *H01L 21/02538* (2013.01); *H01L 21/02603* (2013.01); *H01L 21/02631* (2013.01); *H01L 21/02639* (2013.01); *H01L 21/02576* (2013.01); *H01L 21/02579* (2013.01)

(56) References Cited

U.S. PATENT DOCUMENTS

| | | | |
|---|---|---|---|
| 7,442,575 | B2 | 10/2008 | Coffer et al. |
| 7,594,982 | B1 | 9/2009 | Sager et al. |
| 7,608,147 | B2 | 10/2009 | Samuelson et al. |
| 7,911,035 | B2 | 3/2011 | Seifert et al. |
| 7,965,960 | B2 | 6/2011 | Kim et al. |
| 8,043,942 | B2 * | 10/2011 | Lee .................. H01L 21/0237 257/13 |
| 8,212,335 | B2 | 7/2012 | Fujioka |
| 8,417,153 | B2 | 4/2013 | Kim et al. |
| 8,440,350 | B1 | 5/2013 | Verbrugge et al. |
| 8,455,284 | B2 | 6/2013 | Seong et al. |
| 8,916,850 | B2 | 12/2014 | Yi et al. |
| 9,000,449 | B2 | 4/2015 | Fujioka et al. |
| 9,577,176 | B1 | 2/2017 | Fong et al. |
| 9,666,673 | B2 | 5/2017 | Yi et al. |
| 9,985,150 | B2 | 5/2018 | Yoshimuta et al. |
| 2002/0175408 | A1 | 11/2002 | Majumdar et al. |
| 2003/0044608 | A1 | 3/2003 | Yoshizawa et al. |
| 2005/0217565 | A1 | 10/2005 | Lahreche et al. |
| 2006/0054909 | A1 | 3/2006 | Shin et al. |
| 2006/0125056 | A1 | 6/2006 | Samuelson et al. |
| 2006/0188774 | A1 | 8/2006 | Niu et al. |
| 2007/0177138 | A1 | 8/2007 | Esmaeili |
| 2007/0177139 | A1 | 8/2007 | Kamins et al. |
| 2007/0212538 | A1 | 9/2007 | Niu |
| 2008/0036038 | A1 * | 2/2008 | Hersee ................ B82Y 20/00 257/615 |
| 2008/0081439 | A1 | 4/2008 | Coffer et al. |
| 2008/0142066 | A1 | 6/2008 | Plissonnier et al. |
| 2008/0142926 | A1 | 6/2008 | Seifert et al. |
| 2008/0191317 | A1 | 8/2008 | Cohen et al. |
| 2009/0057649 | A1 | 3/2009 | Sutter et al. |
| 2009/0159907 | A1 | 6/2009 | Wang |
| 2009/0176159 | A1 | 7/2009 | Zhamu et al. |
| 2009/0191317 | A1 | 7/2009 | Lin |
| 2009/0200540 | A1 * | 8/2009 | Bjoerk ................ H01L 29/0673 257/20 |
| 2009/0235862 | A1 | 9/2009 | Cha et al. |
| 2009/0293946 | A1 | 12/2009 | Lin et al. |
| 2010/0029037 | A1 | 2/2010 | Tokuda et al. |
| 2010/0035412 | A1 | 2/2010 | Samuelson et al. |
| 2010/0155702 | A1 | 6/2010 | Wernersson et al. |
| 2010/0171096 | A1 | 7/2010 | Sutter et al. |
| 2010/0252808 | A1 | 10/2010 | Samuelson et al. |
| 2010/0314617 | A1 | 12/2010 | Ito et al. |
| 2010/0320445 | A1 | 12/2010 | Ogihara et al. |
| 2010/0327258 | A1 * | 12/2010 | Lee .................... B82Y 20/00 257/14 |
| 2011/0030991 | A1 | 2/2011 | Veerasamy et al. |
| 2011/0121264 | A1 | 5/2011 | Choi et al. |
| 2011/0129675 | A1 | 6/2011 | Choi et al. |
| 2011/0133061 | A1 | 6/2011 | Yu et al. |
| 2011/0148284 | A1 | 6/2011 | Nagao et al. |
| 2011/0163292 | A1 | 7/2011 | Wang et al. |
| 2011/0168256 | A1 | 7/2011 | Wang et al. |
| 2011/0174626 | A1 | 7/2011 | Hamada et al. |
| 2011/0175059 | A1 | 7/2011 | Kahen et al. |
| 2011/0177683 | A1 | 7/2011 | Kahen et al. |
| 2011/0203651 | A1 | 8/2011 | Nagao et al. |
| 2011/0220171 | A1 | 9/2011 | Mathai et al. |
| 2011/0220864 | A1 | 9/2011 | Kim et al. |
| 2011/0239932 | A1 | 10/2011 | Chang et al. |
| 2011/0240099 | A1 | 10/2011 | Ellinger et al. |
| 2011/0254034 | A1 | 10/2011 | Konsek et al. |
| 2011/0272723 | A1 | 11/2011 | Ha et al. |
| 2011/0313194 | A1 | 12/2011 | Lee et al. |
| 2012/0021554 | A1 | 1/2012 | Neel et al. |
| 2012/0041246 | A1 | 2/2012 | Scher et al. |
| 2012/0056237 | A1 | 3/2012 | Choi et al. |
| 2012/0068122 | A1 | 3/2012 | Kranbuehl et al. |
| 2012/0068153 | A1 | 3/2012 | Seong et al. |
| 2012/0068157 | A1 | 3/2012 | Kub et al. |
| 2012/0087422 | A1 | 4/2012 | Zhou et al. |
| 2012/0090057 | A1 | 4/2012 | Cohen et al. |
| 2012/0132930 | A1 | 5/2012 | Young et al. |
| 2012/0135158 | A1 | 5/2012 | Freer et al. |
| 2012/0141799 | A1 | 6/2012 | Kub et al. |
| 2012/0145549 | A1 | 6/2012 | Cho et al. |
| 2012/0192931 | A1 | 8/2012 | Jeon et al. |
| 2012/0211073 | A1 | 8/2012 | Nagao et al. |
| 2012/0241192 | A1 | 9/2012 | Cai et al. |
| 2012/0270054 | A1 | 10/2012 | Hong et al. |
| 2013/0137220 | A1 | 5/2013 | Matsubara et al. |
| 2013/0153860 | A1 | 6/2013 | Kim et al. |
| 2013/0158322 | A1 | 6/2013 | Nyce et al. |
| 2013/0187128 | A1 | 7/2013 | Yi et al. |
| 2013/0213470 | A1 | 8/2013 | Yi et al. |
| 2013/0221322 | A1 | 8/2013 | Ohlsson et al. |
| 2013/0221385 | A1 | 8/2013 | Shibata et al. |
| 2013/0231470 | A1 | 9/2013 | Iacobelli |
| 2013/0280894 | A1 | 10/2013 | Lee et al. |
| 2013/0311363 | A1 | 11/2013 | Ramaci et al. |
| 2013/0334497 | A1 | 12/2013 | Weman et al. |
| 2014/0151826 | A1 | 6/2014 | Kelber et al. |
| 2014/0161730 | A1 | 6/2014 | Sitharaman et al. |
| 2014/0182668 | A1 | 7/2014 | Pacifici et al. |
| 2014/0252316 | A1 | 9/2014 | Yan et al. |
| 2014/0293164 | A1 | 10/2014 | Kim et al. |
| 2015/0076450 | A1 * | 3/2015 | Weman .................. B82Y 10/00 257/29 |
| 2015/0194549 | A1 | 7/2015 | Fimland et al. |
| 2015/0255677 | A1 * | 9/2015 | Dechoux ................ B82Y 40/00 257/99 |
| 2015/0311363 | A1 | 10/2015 | Park et al. |
| 2016/0005751 | A1 | 1/2016 | Tsui et al. |

FOREIGN PATENT DOCUMENTS

| | | |
|---|---|---|
| CN | 102254969 A | 11/2011 |
| CN | 102376817 | 3/2012 |
| CN | 103050498 A | 4/2013 |
| EP | 1829141 | 9/2007 |
| EP | 1952467 | 8/2008 |
| GB | 2517186 | 2/2015 |
| JP | 2012250868 A | 12/2012 |
| JP | 2014120548 | 6/2014 |
| KR | 20090003840 | 1/2009 |
| KR | 20100094228 A | 8/2010 |
| KR | 20110061492 A | 6/2011 |
| KR | 20120035841 A | 4/2012 |
| KR | 20120092431 | 8/2012 |
| KR | 101517551 | 5/2015 |
| KR | 20120083084 | 5/2015 |
| WO | 2006062947 | 6/2006 |
| WO | 2007061945 | 4/2009 |
| WO | 2010056064 | 5/2010 |
| WO | 2010056061 | 8/2010 |
| WO | 2010096035 | 8/2010 |
| WO | 2011016837 | 2/2011 |
| WO | 2011081440 | 7/2011 |
| WO | 2011090863 | 7/2011 |
| WO | 2012029381 | 3/2012 |
| WO | 2012080252 | 6/2012 |
| WO | 2013104723 | 7/2013 |
| WO | 2013121289 | 7/2013 |

(56) References Cited

FOREIGN PATENT DOCUMENTS

| WO | 2013190128 | 12/2013 |
|---|---|---|
| WO | 2014202796 | 12/2014 |
| WO | 2017009394 A1 | 1/2017 |

OTHER PUBLICATIONS

Pela et al. "Accurate band gaps of AlGaN, InGaN, and AlInN alloys calculations based on LDA-1/2 approach." Appl Phys Lett, 2011, 98, 151907.

Notice of Allowance dated Oct. 30, 2018 in related U.S. Appl. No. 14/371,621 (9 pages).

Bonaccorsco et al., Graphene photonics and optoelectronics, Nature Photonics, 2010, 4, 611.

Boukhvalov et al., Chemical functionalization of graphene with defects, Nano Letters, 2008, 8(12), 4373-4379.

Chung et al., Transferable GaN Layers Grown on ZnO-Coated Graphene Lyers for Optoelectronic Devices, Science, 2010, 330, 655-657.

Cohin et al. Growth of Vertical GaAs Nanowires on an Amorphous Substrate via a Fiber-Textured Si Platform, Nano letters 2013, 13, 2743.

Colombo et al., Ga-assisted cataiyst-free growth mechanism of GaAs nanowires by molecular beam epitaxy, Phys Rev B, 2008, 77, 155326

Dheeraj et al., Controlling crystal phases in GaAs nanowires grown by Au-assisted molecular beam epitaxy, Nanotechnology, 2013, 24, 015601.

Gao et al., Repeated growth and bubbling transfer of graphene with millimetre-size single-crystal grains using platinum, Nat Commun 2012, 3, 699.

Heib et al., Growth mechanisms and optical properties of GaAs-based semiconductor microstructures by selective area epitaxy, Journal of Crystal Growth, 2008, 310, 1049-1056.

Hong et al., Controlled can der Waals Heteroepitaxy of InAs Nanowires on Carbon Honeycomb Lattices, ACS Nano, 2011, 5(9), 7576-7584.

Huh et al., UV/Ozone-Oxidized Large-Scale Graphene Platform with Large Chemical Enhancement in Surface-Enhanced Raman Scattering, ACS Nano, 2011, 5(12), 9799-9806.

Kent et al., Deep ultraviolet emitting polarization induced nanowire light emitting diods with AlxGa(1-x)N active regions, Nanotechnology, 2014, 25, 455201.

Kim et al., Realization of a high mobility dual-gated graphene field-effect transistor with Al2O3 dielectric, Appl. Phys. Lett. 2009, 94, 062107.

Kim et al., Vertically aligned ZnO nanostructures grown on graphene layers, Applied Physics Letters, 2009, 95, 213101-1 through 213101-3.

Kishino et al., Improved Ti-mask selective-area growth (SAG) by rf-plasma-assisted molecular beam epitaxy demonstrating extremely uniform GaN nanocolumn arrays, J. Crystal Growth 2009, 311, 2063-68.

Kneissl, Advances in group III-nitride-based deep UV light-emitting diode technology, Semiconductor Sci and Tech, 2011, 26, 014036.

Mariani et al., Patterned radial GaAs nanopillar solar cells, Nano Letters, 2011, 11, 2490-2494.

Marzouki et al. Structural and optical characterizations of nitrogen doped ZnO nanowires grown by MOCVD, Materials Letters, 2010, 64, 2112-2114

Mohseni et al., Hybrid GaAs-Nanowire Carbon-Nanotube Flexible Photovaltaics, IEEE Journal of Selected Topics in Quantum Electronics, 201, 17(4), 1070-1077.

Mulyana et al., Reverisbie Oxidation of Graphene Through Uitravioiet/Ozone Treatment and its Nonthermal Reduction through Ultraviolet Irradiation, Phys Chem C, 2014, 118(4-7), 27372-27381.

Mulyana et al., Thermal reversibility in electrical characteristics of ultraviolet/ozone-treated graphene, Applied Physics Letters, 2013, 103, 063107.

Munshi et al., Position-Controlled Uniform GaAs Nanowires on Silicon using Nanoimprint Lithography, Nano Letters, 2014, 14, 960-966.

Musolino et al. Compatibility of the selective area growth of GaN nanowires on AlN-buffered Si substrates with the operation of light emitting diodes. Nanotechnology 2015, 26, 085605.

Nevidomskyy et al., Chemically active substitutional nitrogen impurity in carbon nanotubes, Phys Rev Lett, 91, 105502.

Nistor et al., The role of chemistry in graphene doping for carbon-based electronics, ACS Nano, 2011, 5(4), 3096-3103.

Paek et al., MBE-VLS growth of GaAs nanowires on (111)Si substrate, Physica Status Solidi (C), 2008, 5(9), 2740-2742.

Park et al., Inorganic nanostructures grown on graphene layers, Nanoscale, 2011, 3(9), 3522-3533.

Patsha et al., Growth of GaN nanostructures on graphene, Nanoscience, 2011 International Conference on Enginieering and Technology (ICONSET), pp. 553-555.

Peng et al., Control of growth orientation of GaN nanowires, Chemical Physics Letters, 2002, 359, 241-245.

Pierret et al., Generic nanp-imprint process for fabrication of nanowire arrays, Nanotechnology, 21(6), 065305.

Plissard et al., Gold-free growth of GaAs nanowires on silicon: arrays and polytypism, Nanotechnology, 2010, 21, 1-8.

Plissard et al., High yield of self-catalyzed GaAs nanowire arrays grown on silicon via gallium droplet positioning, Nanotechnology, 2011, 22, 275602.

Sun et al., Compounds Semiconductor Nanowire Solar Cells, IEEE Journal of Selected Topics in Quantum Electronics, 2011, 17)(4), 1033-1049.

Toko et al. Selective formation of large-grained (100)- or (111)—oreinted Si on glass by Al—induced layer exchanged. J Appl Phys, 2014, 115, 094301.

Tomioka et al., Control of InAs Nanowire Growth Directions on Si, Nano Letters, 2008, 8(10), 3475-3480.

Wang et al., Growth of Nanowires, Materials Science and Engineering, 2008, 60, 1-51.

Wang et al., Nanocrystal growth on graphene in various degrees of oxidation, Journal of American Chemical Society, 2010, 132, 3270-3271.

Yamaguchi et al., Passivating chemical vapor deposited graphene with metal oxides for transfer and transistor fabrication processes, Appl Phys Lett, 2013, 102, 143505.

Yin et al., Application of CVD graphene as transparent front electrode in Cu(In Ga)Se2 solar cell, 2014 IEEE 40th Photovoltaic Specialist Conference (PVSC), pp. 1740-1744, XP032660257.

Yoon et al., Vertical epitaxial Co5Ge7 nanowires and nanobelt arrays on a thin graphitic layer for flexible Field Emission Displays, Advanced Materials, 2009, 21, 4979-4982.

Yu et al., Electronic properties of nitrogen-atom-adsorbed graphene nanoribbons with armchair edges, IEEE transactions on Nanotechnology, 2010, 9(2).

Zhao et al, Aluminum nitride nanowire light emitting diodes: Breaking the fundamental bottleneck of deep ultraviolet light sources, Scientific Reports, 2015, 5, 8332.

International Search Report and Written Opinion dated Oct. 19, 2016 in related application PCT/EP2016/066694 (13 pages).

International Search Report and Written Opinion dated Oct. 14, 2016 in related application PCT/EP2016/006696 (11 pages).

International Search Report and Written Opinion dated Jan. 11, 2017 in related application PCT/EP2016/068350 (16 pages).

, "Nanocomposite Thin Films and Coatings-Processing, Properties, Performance, Table 2.1. The Physical, Mechanical and Thermal Properties of Hard Materials, 2007, World Scientific."

Jiang, Yeping et al., "Fermi-Level Tuning of Epitaxial Sb2Te3 Thin Films on Graphene by Regulating Intrinsic Defects and Substrate Transfer Doping", Physical Review Letters, 2012, 108:066809.

Park, et al., "Hybrid Semiconductor Nanostructures with Graphene Layers", 2012, Chapter 6.

(56) References Cited

OTHER PUBLICATIONS

Virojanadara, et al., "Large homogeneous mono-/bi-ayer graphene on 6H-SiC (0001) and buffer layer elimination", J Phys D: Appl Phys. 2010, 43, 374010.

Yoo, et al., "Microstructural defects in GaN thin films grown on chemically vapor-deposited graphene layers", Applied Physics Letters 2013, 102 (5): 051908-1-051908-3.

* cited by examiner

Kish graphite flake

PROCESS FOR GROWING NANOWIRES OR NANOPYRAMIDS ON GRAPHITIC SUBSTRATES

This invention concerns the use of a thin graphitic layer as a transparent, conductive and flexible substrate for nanowire or nanopyramid arrays preferably grown by a bottom-up method using metal-organic vapour phase epitaxy (MOVPE) or molecular beam epitaxy (MBE).

BACKGROUND

Over recent years, the interest in semiconductor nanowires has intensified as nanotechnology becomes an important engineering discipline. Nanowires, which are also referred to as nanowhiskers, nanorods, nanopillars, nanocolumns, etc. by some authors, have found important applications in a variety of electrical and optoelectrical devices such as sensors, solar cells to LEDs.

For the purpose of this application, the term nanowire is to be interpreted as a structure being essentially in one-dimensional form, i.e. is of nanometer dimensions in its width or diameter and its length typically in the range of a few 100 nm to a few µm. Usually, nanowires are considered to have at least two dimensions not greater than 500 nm, such as not greater than 350 nm, especially not greater than 300 nm such as not greater than 200 nm.

Many different types of nanowires exist, including metallic (e.g., Ni, Pt, Au), semiconducting (e.g., Si, InP, GaN, GaAs, ZnO), and insulating (e.g., $SiO_2$, $TiO_2$) nanowires. The present inventors are primarily concerned with semiconductor nanowires although it is envisaged that the principles outlined in detail below are applicable to all manner of nanowire technology.

Conventionally, semiconductor nanowires have been grown on a substrate identical to the nanowire itself (homoepitaxial growth). Thus GaAs nanowires are grown on GaAs substrates and so on. This, of course, ensures that there is a lattice match between the crystal structure of the substrate and the crystal structure of the growing nanowire. Both substrate and nanowire can have identical crystal structures. The present invention, however, concerns nanowires grown on graphitic substrates.

Graphitic substrates are substrates composed of single or multiple layers of graphene or its derivatives. In its finest form, graphene is a one atomic layer thick sheet of carbon atoms bound together with double electron bonds (called a $sp^2$ bond) arranged in a honeycomb lattice pattern. Graphitic substrates are thin, light, and flexible, yet very strong.

Compared to other existing transparent conductors such as ITO, ZnO/Ag/ZnO, $TiO_2$/Ag/$TiO_2$, graphene has been proven to have superior optoelectrical properties as shown in a recent review article in Nature Photonics 4 (2010) 611.

The growth of nanowires on graphene is not new. In WO2012/080252, there is a discussion of the growth of semiconducting nanowires on graphene substrates using molecular beam epitaxy. WO2013/104723 concerns improvements on the '252 disclosure in which a graphene top contact is employed on nanowires grown on graphene.

For many applications it will be important that the nanowires can be grown perpendicular to the substrate surface. Semiconductor nanowires normally grow in the [111] direction (if cubic crystal structure) or the [0001] direction (if hexagonal crystal structure). This means that the substrate surface needs to be (111) or (0001) oriented where the surface atoms of the substrate is arranged in a hexagonal symmetry.

One problem, however, is that it is difficult to nucleate a nanowire on a graphene substrate. As the surface of graphene is free of dangling bonds, it is difficult for any nanowire to grow. The graphene is also inert making any reaction between the growing nanowire and the substrate unlikely. The present invention relates, inter alia, to functionalization of the graphene surface or to the inclusion of new layers or small islands on top of the graphene surface to enhance nucleation of nanowires thereon. The inventors still benefit, however, from the remarkable properties of graphene in terms of its strength, flexibility, transparency and electrical conductivity.

The present inventors have surprisingly found that improvements in nanowire or nanopyramid nucleation can be achieved in various ways.

SUMMARY OF INVENTION

Thus, viewed from one aspect the invention provides a process for growing nanowires or nanopyramids comprising:

(I) providing a graphitic substrate and depositing AlGaN, InGaN, AlN or AlGa(In)N on said graphitic substrate at an elevated temperature to form a buffer layer or nanoscale nucleation islands of said compounds;

(II) growing a plurality of semiconducting group III-V nanowires or nanopyramids, preferably III-nitride nanowires or nanopyramids, on the said buffer layer or nucleation islands on the graphitic substrate, preferably via MOVPE or MBE.

Viewed from another aspect the invention provides a process for growing nanowires or nanopyramids comprising:

(I) providing a graphitic substrate and treating said graphitic substrate with nitrogen plasma at an elevated temperature to incorporate nitrogen into said graphitic substrate or/and to form atomic steps/ledges;

(II) growing a plurality of semiconducting group III-V nanowires or nanopyramids on the treated graphitic surface, preferably via MOVPE or MBE.

Viewed from another aspect the invention provides a process for growing nanowires or nanopyramids comprising:

(I) providing a graphitic substrate and depositing on said graphitic substrate Al to form an Al layer or nanoscale Al islands;

(II) exposing said Al layer or nanoscale Al islands to a flux of at least one group V species, e.g. As and/or Sb, thereby forming a buffer layer or nanoscale islands of Al-group V compound(s), e.g. AlAs, AlAsSb or AlSb;

(III) growing a plurality of semiconducting group III-V nanowires or nanopyramids, preferably nanowires or nanopyramids comprising GaAs and/or GaAsSb, on said buffer layer or nanoscale islands on the graphitic substrate, preferably via MOVPE or MBE.

Ideally, the at least one group V species is not N. Thus, viewed from another aspect, the invention provides a process for growing nanowires or nanopyramids comprising:

(I) providing a graphitic substrate and depositing on said graphitic substrate Al to form an Al layer or nanoscale Al islands;

(II) exposing said Al layer or nanoscale Al islands to a flux of at least one non-N group V species, e.g. As and/or Sb, thereby forming a buffer layer or nanoscale islands of Al-non N group V compound, e.g. AlAs, AlAsSb or AlSb;

(III) growing a plurality of semiconducting group III-V nanowires or nanopyramids, preferably nanowires or nanopyramids comprising GaAs and/or GaAsSb, on said buffer layer or nanoscale islands on the graphitic substrate, preferably via MOVPE or MBE.

In a preferred embodiment the group V species is a group V element such as As or Sb or a mixture thereof. The group V element may be in the form of a monomer, dimer, trimer or tetramer of the element such as $As_2$ and $Sb_2$.

Viewed from another aspect the invention provides a process for growing nanowires or nanopyramids comprising:

(I) providing a graphitic substrate and treating said graphitic substrate with oxygen plasma or with ozone, e.g. UV ozone, optionally at an elevated temperature, to form atomic steps/ledges on the graphitic substrate surface and/or so as to form graphene oxide with epoxide groups (C—O) on its surface;

(II) annealing the treated substrate of step (I) in the presence of hydrogen to convert at least a portion of said C—O bonds to C—H bonds;

(III) growing a plurality of semiconducting group III-V nanowires or nanopyramids on the annealed surface of step (II), preferably via MOVPE or MBE.

Viewed from another aspect the invention provides a process for growing nanowires or nanopyramids comprising:

(I) providing a graphitic substrate and depositing on said graphitic substrate an Al layer;

(II) oxidising at least the top part of said Al layer to form an oxidised Al layer;

(III) depositing on said oxidised Al layer an amorphous Si layer;

(IV) heating in order to cause an interchange of the Al layer and amorphous Si layer, and metal-induced-crystallisation (MIC) of the amorphous Si to form a crystallised Si layer;

(V) removing the Al layer and oxide layer, e.g. by etching (VI) growing a plurality of semiconducting group III-V nanowires or nanopyramids on the subsequent crystallized Si layer, preferably via MOVPE or MBE.

Viewed from another aspect the invention provides a product obtained by a process as hereinbefore defined.

Viewed from another aspect the invention provides a device, such as an electronic device, comprising a product as hereinbefore defined, e.g. a solar cell, light emitting device or photodetector.

Definitions

By a group III-V compound semiconductor is meant one comprising at least one element from group III and at least one element from group V. There may be more than one element present from each group, e.g. InGaAs, AlGaN (i.e. a ternary compound), AlInGaN (i.e. a quaternary compound) and so on. The term semiconducting nanowire or nanopyramid is meant nanowire or nanopyramid made of semiconducting materials from group III-V elements.

The term nanowire is used herein to describe a solid, wire-like structure of nanometer dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few μm. Ideally, the nanowire diameter is not greater than 500 nm. Ideally, the nanowire diameter is between 50 and 500 nm, however, the diameter can exceed few microns (called microwires).

Ideally, the diameter at the base of the nanowire and at the top of the nanowire should remain about the same (e.g. within 20% of each other). It will be appreciated that the substrate carries a plurality of nanowires. This may be called an array of nanowires.

The term nanopyramid refers to a solid pyramidal type structure. The term pyramidal is used herein to define a structure with a base whose sides taper to (almost) a single point generally above the centre of the base. It will be appreciated that the single vertex point may appear chamferred. The nanopyramids may have multiple faces, such as 3 to 8 faces, or 4 to 7 faces. Thus, the base of the nanopyramids might be a square, pentagonal, hexagonal, heptagonal, octagonal and so on. The pyramid is formed as the faces taper from the base to a central point (forming therefore triangular faces). The base itself may comprise a portion of even cross-section before tapering to form a pyramidal structure begins. The thickness of the base may therefore be up to 200 nm, such as 50 nm.

The base of the nanopyramids can be 50 and 500 nm in diameter across its widest point. The height of the nanopyramids may be 500 nm to a few microns.

It will be appreciated that the substrate carries a plurality of nanowires or nanopyramids. This may be called an array of nanowires or nanopyramids.

Graphitic layers for substrates or possibly for top contacts are films composed of single or multiple layers of graphene or its derivatives. The term graphene refers to a planar sheet of $sp^2$-bonded carbon atoms in a honeycomb crystal structure.

The term epitaxy comes from the Greek roots epi, meaning "above", and taxis, meaning "in ordered manner". The atomic arrangement of the nanowire or nanopyramid is based on the crystallographic structure of the substrate. It is a term well used in this art. Epitaxial growth means herein the growth on the substrate of a nanowire or nanopyramid that mimics the orientation of the substrate or mimics the orientation of the Si layer, buffer layer or nucleation islands, depending on the embodiment in question.

MBE is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure or a catalyst droplet as described in detail below. Over time, the oncoming atoms form a nanowire.

MOVPE also called as metal organic chemical vapour deposition (MOCVD) is an alternative method to MBE for forming depositions on crystalline substrates. In case of MOVPE, the deposition material is supplied in the form of metal organic precursors, which on reaching the high temperature substrate decompose leaving atoms on the substrate surface. In addition, this method requires a carrier gas (typically $H_2$ and/or $N_2$) to transport deposition materials (atoms/molecules) across the substrate surface. These atoms reacting with other atoms form an epitaxial layer on the substrate surface. Choosing the deposition parameters carefully results in the formation of a nanowire.

The term MIC stands for metal-induced crystallization (MIC). A structure may be formed in which a graphitic substrate carries an Al layer, an oxidised Al layer and an amorphous Si layer, in that order. It is then possible to heat the composition in order to interchange the positions of the Al and Si layers.

DETAILED DESCRIPTION OF INVENTION

This invention concerns the use of graphitic layers as a substrate for nanowire or nanopyramid growth or as a substrate for carrying a further layer on which nanowires or nanopyramids will grow. Ideally, the graphitic layer is transparent, conductive and flexible. The semiconductor nanowire or nanopyramid array comprises a plurality of nanowires or nanopyramids preferably grown epitaxially from said graphitic substrate or from the top layer present.

Having a nanowire or nanopyramid grown epitaxially provides homogeneity to the formed material which may enhance various end properties, e.g. mechanical, optical or electrical properties.

Epitaxial nanowires or nanopyramids may be grown from gaseous, liquid or solid precursors. Because the substrate acts as a seed crystal, the deposited nanowire or nanopyramid can take on a lattice structure and orientation identical to those of the substrate. This is different from other thin film deposition methods which deposit polycrystalline or amorphous films, even on single-crystal substrates.

Substrate for Nanowire or Nanopyramid Growth

The substrate used to grow nanowires or nanopyramids is a graphitic substrate, more especially it is graphene. As used herein, the term graphene refers to a planar sheet of $sp^2$-bonded carbon atoms that are densely packed in a honeycomb (hexagonal) crystal lattice. This graphene substrate should preferably be no more than 20 nm in thickness. Ideally, it should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate in general is 20 nm in thickness or less. Graphene sheets stack to form graphite with an interplanar spacing of 0.335 nm. The graphitic substrate preferred comprises only a few such layers and may ideally be less than 10 nm in thickness. Even more preferably, the graphitic substrate may be 5 nm or less in thickness. The area of the substrate in general is not limited. This might be as much as 0.5 $mm^2$ or more, e.g. up to 5 $mm^2$ or more such as up to 10 $cm^2$. The area of the substrate is thus only limited by practicalities.

In a highly preferred embodiment, the substrate is a laminated substrate exfoliated from a Kish graphite, a single crystal of graphite or is a highly ordered pyrolytic graphite (HOPG). Alternatively, the substrate could be grown on a Ni film or Cu foil by using a chemical vapour deposition (CVD) method. The substrate could be a chemical vapour deposition (CVD)-grown graphene substrate on metallic films or foils made of e.g. Cu, Ni, or Pt, and on semiconductors such as Si and Ge, and on insulators such as $SiO_2$ and $Al_2O_3$. High quality graphene grown on SiC film by Si sublimation at high temperature could be also used.

These grown graphitic layers can be exfoliated from the growth substrate and transferred. For example, CVD-grown graphitic layers can be chemically exfoliated from the metal foil such as a Ni or Cu film by etching or by an electrochemical delamination method. The graphitic layers after exfoliation are then transferred and deposited to the supporting substrates for nanowire or nanopyramid growth. During the exfoliation and transfer, e-beam resist or photo-resist may be used to support the thin graphene layers. These supporting materials can be easily removed by acetone after deposition.

As previously noted, however, nucleation on the graphene surface is difficult so the inventors propose various routes to improve nucleation by modifying the graphene surface or adding a further layer on top of the graphene surface.

In a first embodiment, a thin buffer layer or nanoscale nucleation islands could be grown on the graphitic surface. The buffer layer could be made of AlN or AlGaN or AlGaInN or InGaN, which enhances the density, and controls the polarity and orientation of nanowires or nanopyramids such as GaN. Use of AlN buffer layer has been previously reported for GaN nanowire or nanopyramid growth on Si substrates (Nanotechnology 26 (2015) 085605); however, not on graphitic substrates. The buffer layer on the graphitic substrate can be grown by migration enhanced epitaxy (MEE). Tuning the growth conditions, such as temperature and VIII ratio, and the thickness of the buffer layer, the density, alignment and polarity of the nanowires or nanopyramids can be controlled.

In an alternative process, the inventors observed that instead of using a buffer layer, nanoscale nucleation islands of AlN or AlGaN or AlGaInN or InGaN on graphitic substrate can be used to facilitate the growth of nanowires or nanopyramids. These nucleation islands increase the density, and control the polarity and alignment of nanowires or nanopyramids. More specifically, AlGaN islands can be grown on a graphitic substrate. The density of the islands can be increased by increasing the island growth time. Then the nanowire or nanopyramid growth (e.g. GaN or AlGaN) can be initiated on the said islands.

The use of nucleation islands as compared to a buffer layer has some additional advantages. For example the graphitic surface does not get covered by the buffer layer that might reduce the transparency of graphene. Furthermore, since the nucleation island size (typically 5-20 nm) is much smaller than the nanowire or nanopyramid diameter (typically 50-500 nm), the electrical conduction path between nanowire or nanopyramid and graphene is not much compromised; especially, with regard to the case when the buffer layer is undoped or has a higher bandgap (e.g. AlN and AlGaN) than the nanowire or nanopyramid (e.g. GaN and InGaN).

In a further embodiment, before nanowire or nanopyramid growth the graphitic surface is subjected to a nitrogen plasma, leading to the incorporation of nitrogen as a substitutional impurity or/and formation of ledges and step edges on its surface, preferably both. The atomic ledges facilitate the nucleation of nanowires or nanopyramids as mentioned above. The inclusion of nitrogen changes the Fermi level and hence the electronic structure of the graphitic substrate (Nano Lett. 8, 4373, (2008)). The inclusion of nitrogen also increases the chemical reactivity of the graphitic substrate and makes nanowire or nanopyramid nucleation on the surface easier. In particular, doping, such as n-type doping of the graphene in combination with nitrogen plasma may facilitate nanowire or nanopyramid growth and further device fabrication.

In an alternative process, the invention relates to the introduction of a buffer layer or nanoscale islands of an Al-group V compound such as AlAs, AlAsSb or AlSb on the graphitic substrate.

Al is first deposited on the graphitic substrate to form a thin Al layer or nanoscale Al islands on the graphitic substrate. Due to the relatively high binding energy and thus a low diffusion coefficient of the Al adatoms, Al tends to stick on the graphitic surface. Group V element flux such as As and/or Sb fluxes are provided onto the above Al layer or nanoscale islands, thereby forming a buffer layer or nanoscale islands of Al-group V compound such as AlAs, AlAsSb or AlSb. A change in the surface energy by the introduction of the buffer layer or nanoscale islands facilitates the nucleation and growth of nanowires or nanopyramids. The flux may be in the form of monomers, dimers, trimers or tetramers, such as $As_2$ and $Sb_2$.

In particular, an Al layer of nominal thickness 0.01 to 2 nm is deposited on the graphitic substrate such as at temperatures between 500-700° C. The layer is then transformed into a buffer layer or nanoscale islands of AlAs, AlAsSb or AlSb by supplying As and/or Sb fluxes such as in the range of $0.05\text{-}5\times10^{-6}$ Torr, such as $1\text{-}3\times10^{-6}$ Torr. Then Ga droplets are formed on the said buffer layer or nanoscale islands by supplying only Ga flux to catalyse the growth of a plurality of semiconducting group III-V nanowires, preferably nanowires comprising GaAs and/or GaAsSb, on said buffer layer or nucleation islands on the graphitic substrate, preferably via MOVPE or MBE. Nanowires preferably grow perpendicular to the substrate.

In a further embodiment, defects and holes of single or multiple atomic layers in depth are formed on the graphitic substrate. We also call these defects or holes steps or ledges. In other words therefore, many steps are created on the graphitic substrate that aid the nucleation of nanowires or nanopyramids. This can be achieved through treatment with oxygen plasma or through treatment with ozone, e.g. UV and ozone. The treatment is preferably effected at elevated temperature, such as 100° C. or more, ideally 125 to 175° C., such as 150° C. The etching process appears to work better at these slightly elevated temperatures. Moreover, the use of elevated temperatures begins the annealing process described below.

As well as introducing steps or ledges or alternatively to the introduction of steps or ledges, this treatment introduces oxygen atoms to the surface of the graphitic layer, typically via the formation of an epoxide group on the graphitic surface. Preferably, the treatment introduces both ledges/steps and oxygen atoms to the surface of the graphitic layer. The use of elevated temperatures during the treatment process may also enhance the etching process (i.e. the formation of ledges).

Preferably, this surface treatment results in the formation of a rough graphitic surface, with holes and defects on the surface of the graphitic substrate, and the carbon dangling bonds are bonded with oxygen atoms. The introduction of ledges onto the substrate surface increases the surface roughness and creates a fluctuation in surface potential of the substrate making nucleation thereon easier.

The surface of the UV-ozone or oxygen plasma treated graphitic substrate could itself be used as a surface for nanowire or nanopyramid nucleation; however, the inventors have found that annealing the treated graphitic substrate with hydrogen results in a more interesting surface for nanowire or nanopyramid nucleation.

In particular, therefore the ozone or oxygen plasma treated graphitic substrate is annealed in the presence of hydrogen, typically in an inert atmosphere. The annealing process may take place at a temperature of 100 to 500° C., such as 250 to 400° C. A suitable graphene treatment process is described in Science 330 (2010) 655. The inert gas is typically nitrogen or a noble gas such as argon. The annealing process reduces the epoxide surface groups at the ledges down to C—H groups and therefore provides an improved surface for nanowire or nanopyramid nucleation and hence nanowire or nanopyramid growth. Without wishing to be limited by theory, the C—H bond is believed to break at the elevated temperatures used for nanowire or nanopyramid growth, leaving the surface with dangling bond for the nanowire or nanopyramid nucleation to take place. Also, it is believed that the oxygen or ozone treatment causes vertical etching of the graphitic substrate and hence the introduction of ledges/steps. The annealing process causes lateral etching increasing surface roughness across the surface of the substrate.

In a final embodiment, the invention relates to the introduction of a crystalline Si layer, in particular an alpha-crystalline Si(111) layer onto the graphitic substrate using the metal-induced crystallization (MIC) process. This crystalline Si layer allows nanowire or nanopyramid growth in the [111] direction and hence the formation of perpendicular nanowires or nanopyramids.

It is very difficult to introduce a Si(111) layer directly onto a graphitic substrate however. The inventors therefore propose to introduce first an Al layer on the substrate. That Al layer can be deposited by any known technique such as e-beam or thermal evaporation, atomic layer deposition (ALD), CVD and so on. Especially, the inventors have shown that the electron beam evaporation of Al can be used, something which ensures that the graphitic surface is not damaged in said process.

Ideally, the graphitic surface is modified only at those spots where nanowires are to nucleate, whereas the rest of the graphitic surface should remain undamaged in order to keep the good electrical properties of the graphitic surface between the nanowires or nanopyramids.

The Al layer is preferably 10 to 30 nm in thickness. The uppermost atomic layers of this Al layer are preferably oxidised by exposing the Al to an oxygen source such as air. The uppermost atomic layers are preferably represented by around the top 5 nm of the Al layer.

Thereafter, a Si layer is applied on top of the oxidised Al layer (aluminium oxide layer). Again, the same application techniques can be employed. The Si layer is amorphous at this point. Thus, a structure is preferably formed in which a graphitic substrate carries an Al layer, an oxidised Al layer and an amorphous Si layer, in that order. The Si layer can be 5 to 50 nm in thickness It is then possible to heat the composition in order to interchange the positions of the Al and Si layers. Annealing may take place at a temperature of 300 to 500° C. Typically, annealing occurs in an inert atmosphere, such as an atmosphere of nitrogen.

Without wishing to be limited by theory, in general the as-deposited Al layer on arbitrary substrates is polycrystalline with no preferential orientation of the grains. The Si layer is also amorphous at this stage with no crystalline Si before annealing. Therefore, the initial bilayer consists of amorphous Si on top of polycrystalline Al, with a thin oxide interface. On annealing, Si atoms diffuse into the Al layer and form spontaneously crystalline nuclei. The driving force is the free energy difference between the amorphous and crystalline phases of Si. At the end of the crystallization process, the Al and Si layers have exchanged their initial stacking position: the Al layer is on top of the stack. Typically, a (Si)Al-oxide layer is located between the Al and Si layers at this point. Depending on the crystallinity of the Al layer and its oxidation condition, the crystallization of Si grains is determined.

A similar process is described in Nano Lett. 13, 2743 (2013). A similar disclosure can also be found in J. Appl. Phys. 115, 094301 (2014). However, these reference papers have not carried out the process on a conducting substrate, especially a graphitic substrate. Moreover the sputtering method was used to deposit the (111)-oriented Al layer for the crystallization of (111)-oriented Si film on the substrates. The deposition of Al by sputtering is, however, not suitable for graphitic substrates. High energy ions in plasma generated during the sputter process can easily damage the carbon bonds in graphene.

The present inventors have found that the electron beam evaporation of Al on graphene can give a preferable (111)-orientation of the Al layer, which is much enhanced compared to that on amorphous $SiO_2$ substrates. This subsequently results in a highly (111)-oriented Si film on graphene after the AIC process without any damage in the graphene substrate.

The Al layer can then be removed, preferably via etching of the Al layer (as well as any (Si)Al-oxide in-between the two layers) to leave a substrate coated with a mainly (111) crystalline nanostructured Si layer on the graphitic substrate. The Si layer at this point can be 5 to 50 nm in thickness. Since the Si layer is very thin, the properties of underlying graphene can still be realised, i.e. it will still be flexible, conductive and mostly transparent. A further advantage of using the Si layer is that the nanowire or nanopyramid growth recipe can readily be transferred from the growth on standard Si(111) substrates. Since the nanowire or nanopyramid growth takes place on the Si layer on top of graphic substrate, the standard recipes for growing III-V nanowires or nanopyramids on Si can readily be applied. Moreover, the density of nanowires or nanopyramids is much higher than on the bare graphitic substrate. In addition one can grow nanowires or nanopyramids at a higher temperature which is generally used for the nanowire or nanopyramid growth on Si(111) instead of the two step growth of nanowires or nanopyramids on graphitic substrates involving a low-temperature step, which is the cause for the two-dimensional growth of (unwanted) parasitic III-V semiconductor materials. This would decrease the parasitic crystal growth of III-V semiconductor materials on the substrate. Combining with a mask with hole pattern on top of the Si(111) layer, one can achieve the nanowire or nanopyramid growth only at exposed hole region by high temperature growth, resulting in a position-controlled or selective area growth.

Support for Substrate

The graphitic substrate may need to be supported in order to allow growth of the nanowires or nanopyramids thereon. The substrate can be supported on any kind of material including conventional semiconductor substrates and transparent glasses. It is preferred if the support is transparent so that the substrate does not block light from exiting or entering the device.

Examples of preferred substrates include fused silica, fused quartz, fused alumina, silicon carbide or AlN. The use of fused silica or SiC is preferred, especially fused silica. The support should be inert. After nanowire or nanopyramid growth and before use in a device, the support might be removed, e.g. by peeling away the support from the graphitic substrate.

Growth of Nanowires or Nanopyramids

In order to prepare nanowires or nanopyramids of commercial importance, it is preferred that these grow epitaxially on the substrate, Si layer, buffer layer or nucleation islands. It is also ideal if growth occurs perpendicular to the growing surface and ideally therefore in the [111] (for cubic crystal structure) or [0001] (for hexagonal crystal structure) direction.

The present inventors have determined that epitaxial growth on graphitic substrates is possible by determining a possible lattice match between the atoms in the semiconductor nanowire or nanopyramid and the carbon atoms in the graphene sheet.

The carbon-carbon bond length in graphene layers is about 0.142 nm. Graphite has hexagonal crystal geometry. The present inventors have previously realised that graphite can provide a substrate on which semiconductor nanowires or nanopyramids can be grown as the lattice mismatch between the growing nanowire or nanopyramid material and the graphitic substrate can be very low.

The inventors have realised that due to the hexagonal symmetry of the graphitic substrate and the hexagonal symmetry of the semiconductor atoms in the (111) planes of a nanowire or nanopyramid growing in the [111] direction with a cubic crystal structure (or in the (0001) planes of a nanowire or nanopyramid growing in the [0001] direction with a hexagonal crystal structure), a lattice match can be achieved between the growing nanowires or nanopyramids and the substrate.

A comprehensive explanation of the science here can be found in WO2013/104723.

Without wishing to be limited by theory, due to the hexagonal symmetry of the carbon atoms in graphitic layers, and the hexagonal symmetry of the atoms of cubic or hexagonal semiconductors in planes normal to the [111] and [0001] crystal direction, respectively, (a preferred direction for most nanowire or nanopyramid growth), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of nanowires or nanopyramids on graphitic substrates.

The different hexagonal arrangements of the semiconductor atoms as described in WO2013/104723, can enable semiconductor nanowires or nanopyramids of such materials to be vertically grown to form free standing nanowires or nanopyramids on top of a thin carbon-based graphitic material.

In a growing nanopyramid, the triangular faces are normally terminated with (1-101) or (1-102) planes. The triangular side surfaces with (1-101) facets could either converge to a single point at the tip or could form a new facets ((1-102) planes) before converging at the tip. In some cases, the nanopyramids are truncated with its top terminated with {0001} planes.

Whilst it is ideal that there is no lattice mismatch between a growing nanowire or nanopyramid and the substrate, nanowires or nanopyramids can accommodate much more lattice mismatch than thin films for example. The nanowires or nanopyramids of the invention may have a lattice mismatch of up to about 10% with the substrate and epitaxial growth is still possible. Ideally, lattice mismatches should be 7.5% or less, e.g. 5% or less.

For some semiconductors like cubic InAs (a=6.058 Å), cubic GaSb (a=6.093 Å), the lattice mismatch is so small (<~1%) that excellent growth of these semiconductors can be expected.

The nanowire or nanopyramid grown in the present invention may be from 250 nm to several microns in length, e.g. up to 5 microns. Preferably the nanowires or nanopyramids are at least 1 micron in length. Where a plurality of nanowires or nanopyramids are grown, it is preferred if they all meet these dimension requirements. Ideally, at least 90% of the nanowires grown will be at least 1 micron in length. Preferably substantially all the nanowires will be at least 1 micron in length.

Growth of nanowires/nanopyramids can be controlled through flux ratios. Nanopyramids are encouraged, for example if high group V flux is employed.

Moreover, it will be preferred if the nanowires grown have the same dimensions, e.g. to within 10% of each other. Thus, at least 90% (preferably substantially all) of the nanowires will preferably be of the same diameter and/or the same length (i.e. to within 10% of the diameter/length of each other). Essentially, therefore the skilled man is looking for homogeneity and nanowires then are substantially the same in terms of dimensions.

The length of the nanowires or nanopyramids is often controlled by the length of time for which the growing process runs. A longer process typically leads to a (much) longer nanowire.

The nanowires or nanopyramids have typically a hexagonal cross sectional shape. The nanowire or nanopyramid may have a cross sectional diameter of 25 to 200 nm (i.e. its thickness). As noted above, the diameter is ideally constant throughout the majority of the nanowire. Nanowire diameter can be controlled by the manipulation of the ratio of the atoms used to make the nanowire as described further below.

Moreover, the length and diameter of the nanowires or nanopyramids can be affected by the temperature at which they are formed. Higher temperatures encourage high aspect ratios (i.e. longer and/or thinner nanowires). The skilled man is able to manipulate the growing process to design nanowires of desired dimensions.

The nanowires or nanopyramids of the invention are formed from at least one III-V compound. Group III options are B, Al, Ga, In, and Tl. Preferred options here are Ga, Al and In.

Group V options are N, P, As, Sb. All are preferred.

It is of course possible to use more than one element from group (III) and/or more than one element from group (V). Preferred compounds for nanowire or nanopyramid manufacture include AlAs, GaSb, GaP, GaN, AlN, AlGaN, AlGaInN, GaAs, InP, InN, InGaAs, InSb, InAs, or AlGaAs. Compounds based on Al, Ga and In in combination with N are one option. The use of GaN, AlGaN, AlInGaN or AlN is highly preferred, especially in combination with a group III-N buffer layer or nucleation islands.

In some embodiments there are two group III cations with a group V anion are preferred, such as AlGaN. The ternary compounds may therefore be of formula XYZ wherein X is a group III element, Y is a group III different from X, and Z is a group V element. The X to Y molar ratio in XYZ is preferably 0.1 to 0.9, i.e. the formula is preferably $X_xY_{1-x}Z$ where subscript x is 0.1 to 0.9.

Quaternary systems might also be used and may be represented by the formula $A_xB_{1-x}C_yD_{1-y}$ where A and B are group III elements and C and D are group V elements. Again subscripts x and y are typically 0.1 to 0.9. Other options will be clear to the skilled man.

The nanowires or nanopyramids of the invention should preferably grow in the [111] direction for nanowires or nanopyramids with cubic crystal structure and [0001] direction for nanowires or nanopyramids with hexagonal crystal structure. If the crystal structure of the growing nanowire or nanopyramid is cubic, then the (111) interface between the nanowire or nanopyramid and the catalyst droplet represents the plane from which axial growth takes place. If the nanowire or nanopyramid has a hexagonal crystal structure, then the (0001) interface between the nanowire or nanopyramid and the catalyst droplet represents the plane from which axial growth takes place. Planes (111) and (0001) both represent the same (hexagonal) plane of the nanowire, it is just that the nomenclature of the plane varies depending on the crystal structure of the growing nanowire.

The nanowires or nanopyramids are preferably grown by MBE or MOVPE. In the MBE method, the growing surface is provided with a molecular beam of each reactant, e.g. a group III element and a group V element preferably supplied simultaneously. A higher degree of control of the nucleation and growth of the nanowires or nanopyramids on the graphitic substrate might be achieved with the MBE technique by using migration-enhanced epitaxy (MEE) or atomic-layer MBE (ALMBE) where e.g. the group III and V elements can be supplied alternatively.

A preferred technique is solid-source MBE, in which very pure elements such as gallium and arsenic are heated in separate effusion cells, until they begin to slowly evaporate (e.g. gallium) or sublimate (e.g. arsenic). However, a rf-plasma nitrogen source is typically used to produce low energy beams of nitrogen atoms. The gaseous elements then condense on the substrate, where they may react with each other. In the example of gallium and arsenic, single-crystal GaAs is formed. The use of the term "beam" implies that evaporated atoms (e.g. gallium) or molecules (e.g. $As_4$ or $As_2$) do not interact with each other or vacuum chamber gases until they reach the substrate.

MBE takes place in ultra-high vacuum, with a background pressure of typically around $10^{-10}$ to $10^{-9}$ Torr. Nanostructures are typically grown slowly, such as at a speed of up to a few, such as about 10, μm per hour. This allows nanowires or nanopyramids to grow epitaxially and maximises structural performance.

In the MOVPE method, the substrate is kept in a reactor in which the substrate is provided with a carrier gas and a metal organic gas of each reactant, e.g. a metal organic precursor containing a group III element and a metal organic precursor containing a group V element. The typical carrier gases are hydrogen, nitrogen, or a mixture of the two. A higher degree of control of the nucleation and growth of the nanowires or nanopyramids on the graphitic substrate might be achieved with the MOVPE technique by using pulsed layer growth technique, where e.g. the group III and V elements can be supplied alternatively.

The nanowires or nanopyramids of the invention may be grown with or without the presence of a catalyst. Catalyst can be introduced to provide nucleating sites for nanowire or nanopyramid growth. The catalyst can be one of the elements making up the nanowire or nanopyramid—so called self-catalysed, or different from any of the elements making up the nanowire.

For catalyst-assisted growth the catalyst may be Au or Ag or the catalyst may be a metal from the group used in the nanowire or nanopyramid growth (e.g. group III metal), especially one of the metal elements making up the actual nanowire or nanopyramid (self-catalysis). It is thus possible to use another element from group III as a catalyst for growing a III-V nanowire, e.g. use Ga as a catalyst for an In—V) nanowire or nanopyramid and so on. Preferably the catalyst is Au or the growth is self-catalysed (i.e. Ga for a Ga—V) nanowire or nanopyramid and so on). The catalyst can be deposited onto the growing surface to act as a nucleation site for the growth of the nanowires or nanopyramids. Ideally, this can be achieved by providing a thin film of catalytic material formed over the growing surface. When the catalyst film is melted as the temperature increases to the nanowire or nanopyramid growth temperature, the catalyst forms nanometre sized particle-like droplets on the growing surface and these droplets form the points where nanowires or nanopyramids can grow.

This is called vapour-liquid-solid growth (VLS) as the catalyst is the liquid, the molecular beam is the vapour and the nanowire or nanopyramid provides the solid component. In some cases the catalyst particle can also be solid during the nanowire or nanopyramid growth, by a so called vapour-solid-solid growth (VSS) mechanism. As the nanowire or nanopyramid grows (by the VLS method), the liquid (e.g. gold) droplet stays on the top of the nanowire. It remains at the top of the nanowire or nanopyramid after growth and may therefore play a major role in contacting a top electrode.

In order to prepare a more regular array of self-catalysed VLS grown nanowires or nanopyramids with better homogeneity in height and diameter of grown nanowires or nanopyramids, a mask can be used on the substrate. This mask can be provided with regular holes, where catalyst particles (of one of the group-III elements) are deposited in the holes such that nanowires or nanopyramids can grow homogeneously in size in a regular array across the substrate. The hole patterns in the mask can be easily fabricated using conventional photo/e-beam lithography or nanoimprinting. Focussed ion beam technology may also be used in order to create a regular array of nucleation sites on the graphitic surface for the nanowire or nanopyramid growth.

Ideally, there exists only one catalyst particle in a hole.

In order to prepare positioned Au catalysed nanowires or nanopyramids on a substrate, a thin film of Au, such as with a thickness less than 50 nm, can be deposited on a hole-patterned photo or e-beam resist. By removing the photo or e-beam resist in a so called "lift-off" process, a regular arrayed pattern of Au dots on the substrate surface can be fabricated.

The growth of nanowires or nanopyramids without the presence of a catalyst is also possible and is known as selective area growth method. This method may require a mask with nano-hole patterns deposited on the graphitic layers as described herein. The mask material can be an oxide or nitride masking layer, preferably a metal oxide or metal nitride layer or semimetal oxide or semimetal nitride). The mask layer can be applied through atomic layer deposition or the techniques discussed above in connection with the deposition of the other layers. The oxide used is preferably based on a metal or semimetal (such as Si). The nature of the cation used in the masking layer may be Al, Si or a transition metal, especially a first 3d row transition metal (Sc—Zn). Preferred masking layers are based on oxides, such as $SiO_2$, $Si_3N_4$, $TiO_2$ or $Al_2O_3$, $W_2O_3$, and so on.

Masking layers may be 5 to 100 nm in thickness, such as 10 to 50 nm.

The masking layer is preferably continuous and covers the substrate as a whole. This ensures that the layer is defect-free and thus prevents nucleation of nanowires or nanopyramids on the masking layer.

Thus a mask can be applied to the substrate and etched with holes exposing the substrate surface, optionally in a regular pattern. Moreover, the size and the pitch of the holes can be carefully controlled. By arranging the holes regularly, a regular pattern of nanowires or nanopyramids can be grown.

Moreover, the size of the holes can be controlled to ensure that only one nanowire or nanopyramid can grow in each hole. Finally, the holes can be made of a size where the hole is sufficiently large to allow nanowire or nanopyramid growth. In this way, a regular array of nanowires can be grown.

The graphitic surfaces may be treated with the above mentioned techniques (oxygen or ozone treatment and hydrogenation, nitrogen plasma, MIC of amorphous silicon, deposition of buffer layer, or formation of nucleation islands) before or after the deposition of mask.

As noted above, it is also possible to prepare self-catalysed nanowires. By self-catalysed is meant that one of the components of the nanowire or nanopyramid acts as a catalyst for its growth.

For example, a Ga layer can be applied to the hole-patterned mask layer, melted to form droplets acting as nucleation sites for the growth of Ga containing nanowires. Again, a Ga metal portion may end up positioned on the top of the nanowire.

In more detail, for MBE for example, a Ga/In flux can be supplied to the substrate surface for a period of time to initiate the formation of Ga/In droplets on the surface upon heating of the substrate. The substrate temperature can then be set to a temperature suitable for the growth of the nanowire or nanopyramid in question. The growth temperature may be in the range 300 to 700° C. The temperature employed is, however, specific to the nature of the material in the nanowire, the catalyst material and the substrate material. For GaAs and/or GaAsSb, a preferred temperature is 540 to 630° C., e.g. 590 to 630° C., such as 610° C. For InAs the range is lower, for example 420 to 540° C., such as 430 to 540° C., e.g. 450° C.

Nanowire or nanopyramid growth can be initiated by opening the shutter of the Ga/In effusion cell and the counter ion effusion cell, simultaneously once a catalyst film has been deposited and melted.

The temperature of the effusion cells can be used to control growth rate. Convenient growth rates, as measured during conventional planar (layer by layer) growth, are 0.05 to 2 µm per hour, e.g. 0.1 µm per hour.

The pressure of the molecular beams can also be adjusted depending on the nature of the nanowire or nanopyramid being grown. Suitable levels for beam equivalent pressures are between $1\times10^{-7}$ and $1\times10^{-5}$ Torr.

The beam flux ratio between reactants (e.g. group III atoms and group V molecules) can be varied, the preferred flux ratio being dependent on other growth parameters and on the nature of the nanowire or nanopyramid being grown.

It has been found that the beam flux ratio between reactants can affect crystal structure of the nanowire. For example, using Au as a catalyst, growth of GaAs nanowires with a growth temperature of 540° C., a Ga flux equivalent to a planar (layer by layer) growth rate of 0.6 µm per hour, and a beam equivalent pressure (BEP) of $9\times10^{-6}$ Torr for $As_4$ produces wurtzite crystal structure. As opposed to this, growth of GaAs nanowires at the same growth temperature, but with a Ga flux equivalent to a planar growth rate of 0.9 µm per hour and a BEP of $4\times10^{-6}$ Torr for $As_4$, produces zinc blende crystal structure.

Nanowire or nanopyramid diameter can in some cases be varied by changing the growth parameters. For example, when growing self-catalyzed GaAs nanowires under conditions where the axial nanowire or nanopyramid growth rate is determined by the $As_4$ flux, the nanowire or nanopyramid diameter can be increased/decreased by increasing/decreasing the Ga:As$_4$ flux ratio. The skilled man is therefore able to manipulate the nanowire or nanopyramid in a number of ways.

It is thus an embodiment of the invention to employ a multistep, such as two step, growth procedure, e.g. to separately optimize the nanowire or nanopyramid nucleation and nanowire or nanopyramid growth.

A significant benefit of MBE is that the growing nanowire or nanopyramid can be analysed in situ, for instance by using reflection high-energy electron diffraction (RHEED). RHEED is a technique typically used to characterize the surface of crystalline materials. This technology cannot be applied so readily where nanowires are formed by other techniques such as MOVPE.

The nanowires of the invention preferably grow as cubic (zinc blende) or hexagonal (wurtzite) structures. The inventors have found that it is possible to change the crystal structure of the growing nanowire or nanopyramid by manipulating the amounts of the reactants fed to the substrate as discussed above. Higher feeds of Ga, for example, force a GaAs crystal into the cubic crystal structure. Lower feeds encourage a hexagonal structure. By manipulating reactant concentrations, the crystal structure within the nanowire or nanopyramid can therefore be changed.

A significant benefit of MOVPE is that the nanowires or nanopyramids can be grown at a much faster growth rate. Both radial and axial heterostructured nanowires can be grown using the MOVPE method. However, for certain III-V semiconductors such as III-nitrides, this method favours the growth of radial heterostructured nanowires and microwires, for example: n-doped GaN core with shell consisting of intrinsic GaN/InGaN multiple quantum wells (MQW), p-doped AlGaN electron blocking layer (EBL) and p-doped GaN shell. This method also allows the growth of axial heterostructured nanowires using techniques such as pulsed growth technique or continuous growth mode with modified growth parameters for e.g., lower VIII molar ratio and higher substrate temperature.

In more detail, the reactor is evacuated after placing the sample, and is purged with N$_2$ to remove oxygen and water in the reactor. This is to avoid any damage to the graphitic substrate at the growth temperatures, and to avoid unwanted reactions of oxygen and water with the precursors. The reactor pressure is set to be between 50 and 400 Torr. After purging the reactor with N$_2$, the substrate is thermally cleaned under H$_2$ atmosphere at a substrate temperature of about 1200° C. Subsequently, a very thin buffer layer or nucleation islands is grown which consists of Al(In)GaN or AlN by introducing metal organic precursors and NH$_3$. The metal organic precursors can be either trimethylgallium (TMGa), or triethylgallium (TEGa) for Ga, trimethylalumnium (TMA1) or triethylalumnium (TEA1) for Al, and trimethylindium (TMIn) or triethylindium (TEIn) for In. The metal precursors for dopants can be SiH$_4$ for silicon and bis(cyclopentadienyl)magnesium (Cp$_2$Mg) or bis(methylcyclopentadienyl)magnesium ((MeCp)$_2$Mg) for Mg. During the Al(In)GaN or AlN buffer layer or nucleation islands deposition, the substrate temperature may be set in the range of 600 to 1200° C. The flow rates of TMGa, TMA1 and TMIn can be maintained between 5 and 100 sccm. The NH$_3$ flow rate can be varied between 5 and 550 sccm. TMGa/TMA1 and NH$_3$ are supplied to the substrate surface for a period of time to initiate the formation of Al(In)GaN or AlN buffer layer or nucleation islands on the graphitic surface. The growth parameters used for buffer layer or nucleation islands can strongly influence the density, polarity and alignment of the nanowires. The substrate temperature can then be set to a temperature suitable for the growth of the nanowire or nanopyramid in question. The growth temperature may be in the range 700 to 1200° C. The temperature employed is, however, specific to the nature of the material in the nanowire. For GaN nanowires, a preferred temperature is 800 to 1150° C., e.g. 900 to 1100° C., such as 1100° C. For AlGaN nanowires or nanopyramids, the range is slightly higher, for example 900 to 1400° C., such as 1050 to 1250° C., e.g. 1250° C.

The nanowires or nanopyramids of the invention preferably grow epitaxially. They attach to the underlying substrate through covalent, ionic or quasi van der Waals binding. Accordingly, at the junction of the growing surface and the base of the nanowire, crystal planes are formed epitaxially within the nanowire. These build up, one upon another, in the same crystallographic direction thus allowing the epitaxial growth of the nanowire. Preferably the nanowires or nanopyramids grow perpendicularly. It will be appreciated that in experimental science the growth angle may not be exactly 90° but the term perpendicularly implies that the nanowires are within about 10° of perpendicular, e.g. within 5°. Because of the epitaxial growth via covalent, ionic or quasi van der Waals bonding, it is expected that there will be an intimate contact between the nanowires or nanopyramids and the growing surface. To enhance the contact property further, the substrate can be doped to match the major carriers of grown nanowires or nanopyramids.

Because nanowires or nanopyramids are epitaxially grown involving physical and chemical bonding to growing surfaces at high temperature, the bottom contact is preferably ohmic.

It will be appreciated that the inventive compositions comprise a plurality of nanowires or nanopyramids. Preferably the nanowires or nanopyramids grow about parallel to each other. It is preferred therefore if at least 90%, e.g. at least 95%, preferably substantially all nanowires or nanopyramids grow in the same direction from the same plane of the growing surface.

It will be appreciated that there are many planes from which epitaxial growth could occur. It is preferred if substantially all nanowires or nanopyramids grow from the same plane. It is preferred if that plane is parallel to the substrate surface. Ideally the grown nanowires or nanopyramids are substantially parallel. Preferably, the nanowires or nanopyramids grow substantially perpendicular to the growing surface.

Doping

The nanowires or nanopyramids of the invention can contain a p-n or p-i-n junction, e.g. to enable their use in LEDs. Nanowires or nanopyramids of the invention are therefore provided with an undoped intrinsic semiconductor region between a p-type semiconductor and an n-type semiconductor region. All of or sections of the p-type and n-type regions are typically heavily doped because they are used for ohmic contacts.

It is therefore preferred that the nanowires or nanopyramids are doped. Doping typically involves the introduction of impurity ions into the nanowire, e.g. during MBE or MOVPE growth. The doping level can be controlled from ~$10^{15}$/cm$^3$ to $10^{20}$/cm$^3$. The nanowires or nanopyramids can be p-doped or n-doped as desired. Doped semiconductors are extrinsic semiconductors.

The n(p)-type semiconductors have a larger electron (hole) concentration than hole (electron) concentration by doping an intrinsic semiconductor with donor (acceptor) impurities. Suitable donor (acceptors) for III-V compounds can be Te (Mg, Be and Zn). Dopants can be introduced during the growth process or by ion implantation of the nanowires or nanopyramids after their formation.

Higher carrier injection efficiency is required to obtain higher external quantum efficiency (EQE) of LEDs. However, the increasing ionization energy of Mg acceptors with increasing Al content in AlGaN alloys makes it difficult to obtain higher hole concentration in AlGaN alloys with higher Al content. To obtain higher hole injection efficiency (especially in the p-region layers consisting of high Al content), the inventors have devised a number of strategies which can be used individually or together.

There are problems to overcome in the doping process therefore. It is preferred if the nanowires or nanopyramids of the invention comprise Al. The use of Al is advantageous as high Al content leads to high band gaps, enabling UV-C LED emission from the active layer(s) of nanowires or nanopyramids and/or avoiding absorption of the emitted light in the p-region and/or n-region layers. Where the band gap is high, it is less likely that UV light is absorbed by this part of the nanowires or nanopyramids. The use therefore of AlN or AlGaN in nanowires or nanopyramids is preferred.

However, p-type doping of AlGaN or AlN to achieve high electrical conductivity (high hole concentration) is challenging as the ionization energy of Mg or Be acceptors increases with increasing Al content in AlGaN alloys. The present inventors propose various solutions to maximise electrical conductivity (i.e. maximise hole concentration) in AlGaN alloys with higher average Al content.

Where the nanowires or nanopyramids comprise AlN or AlGaN, achieving high electrical conductivity by introducing p-type dopants is a challenge. One solution relies on a short period superlattice (SPSL). In this method, we grow a superlattice structure consisting of alternating layers with different Al content instead of a homogeneous AlGaN layer with higher Al composition. For example, a p-region layer with 35% Al content could be replaced with a 1.8 to 2.0 nm period SPSL consisting of, for example, alternating $Al_xGa_{1-x}N:Mg/Al_yGa_{1-y}N:Mg$ with x=0.30/y=0.40. The low ionization energy of acceptors in layers with lower Al composition leads to improved hole injection efficiency without compromising on the barrier height in the p-region layer. This effect is additionally enhanced by the polarization fields at the interfaces. The SPSL can be followed with a highly p-doped GaN:Mg layer for better hole injection.

More generally, the inventors propose to introduce a p-type doped $Al_xGa_{1-x}N/Al_yGa_{1-y}N$ short period superlattice (i.e. alternating thin layers of $Al_xGa_{1-x}N$ and $Al_yGa_{1-y}N$) into the nanowires or nanopyramid structure, where the Al mole fraction x is less than y, instead of a p-type doped $Al_zGa_{1-z}N$ alloy where x<z<y. It is appreciated that x could be as low as 0 (i.e. GaN) and y could be as high as 1 (i.e. AlN). The superlattice period should preferably be 5 nm or less, such as 2 nm, in which case the superlattice will act as a single $Al_zGa_{1-z}N$ alloy (with z being a layer thickness weighted average of x and y) but with a higher electrical conductivity than that of the $Al_zGa_{1-z}N$ alloy, due to the higher p-type doping efficiency for the lower Al content $Al_zGa_{1-z}N$ layers.

In the nanowires or nanopyramids comprising a p-type doped superlattice, it is preferred if the p-type dopant is an alkali earth metal such as Mg or Be.

A further option to solve the problem of doping an Al containing nanowire/nanopyramid follows similar principles. Instead of a superlattice containing thin AlGaN layers with low or no Al content, a nanostructure can be designed containing a gradient of Al content (mole fraction) in the growth direction of the AlGaN within the nanowires or nanopyramids. Thus, as the nanowires or nanopyramids grow, the Al content is reduced/increased and then increased/reduced again to create an Al content gradient within the nanowires or nanopyramids.

This may be called polarization doping. In one method, the layers are graded either from GaN to AlN or AlN to GaN. The graded region from GaN to AlN and AlN to GaN may lead to n-type and p-type conduction, respectively. This can happen due to the presence of dipoles with different magnitude compared to its neighbouring dipoles. The GaN to AlN and AlN to GaN graded regions can be additionally doped with n-type dopant and p-type dopant respectively.

In a preferred embodiment, p-type doping is used in AlGaN nanowires using Be as a dopant.

Thus, one option would be to start with a GaN nanowire/nanopyramid and increase Al and decrease Ga content gradually to form AlN, perhaps over a growth thickness of 100 nm. This graded region could act as a p- or n-type region, depending on the crystal plane, polarity and whether the Al content is decreasing or increasing in the graded region, respectively. Then the opposite process is effected to produce GaN once more to create an n- or p-type region (opposite to that previously prepared). These graded regions could be additionally doped with n-type dopants such as Si and p-type dopants such as Mg or Be to obtain n- or p-type regions with high charge carrier density, respectively. The crystal planes and polarity is governed by the type of nanowire/nanopyramid as is known in the art.

Viewed from another aspect therefore, the nanowires or nanopyramids of the invention comprise Al, Ga and N atoms wherein during the growth of the nanowires or nanopyramids the concentration of Al is varied to create an Al concentration gradient within the nanowires or nanopyramids.

In a third embodiment, the problem of doping in an Al containing nanowire or nanopyramid is addressed using a tunnel junction. A tunnel junction is a barrier, such as a thin layer, between two electrically conducting materials. In the context of the present invention, the barrier functions as an ohmic electrical contact in the middle of a semiconductor device.

In one method, a thin electron blocking layer is inserted immediately after the active region, which is followed by a p-type doped AlGaN layer with Al content higher than the Al content used in the active layers. The p-type doped layer is followed by a highly p-type doped AlGaN layer and a very thin tunnel junction layer followed by an n-type doped AlGaN layer. The tunnel junction layer is chosen such that the electrons tunnel from the valence band in p-AlGaN to the conduction band in the n-AlGaN, creating holes that are injected into the p-AlGaN layer.

More generally, it is preferred if the nanowire or nanopyramid comprises two regions of doped GaN (one p- and one n-doped region) separated by an Al layer, such as a very thin Al layer. The Al layer might be a few nm thick such as 1 to 10 nm in thickness. It is appreciated that there are other optional materials that can serve as a tunnel junction which includes highly doped InGaN layers.

It is particularly surprising that doped GaN layers can be grown on the Al layer.

In one embodiment therefore, the invention provides a nanowire or nanopyramid having a p-type doped (Al)GaN region and an n-type doped (Al)GaN region separated by an Al layer.

The nanowires or nanopyramids of the invention can be grown to have a heterostructured form radially or axially. For example for an axial heterostructured nanowire, p-n junction can be axially formed by growing a p-type doped core first, and then continue with an n-doped core (or vice versa). For a radially heterostructured nanowire, p-n junction can be radially formed by growing the p-doped nanowire or nanopyramid core first, and then the n-doped semiconducting shell is grown (or vice versa)—a core shell nanowire. An intrinsic shell can be grown between doped regions to obtain a radially heterostructured nanowire or nanopyramid with p-i-n junction.

It is preferred if the nanowires or nanopyramids are grown axially and are therefore formed from a first section and a second section. The two sections are doped differently to generate a p-n junction or p-i-n junction. It does not matter whether the top or bottom section of the nanowire or nanopyramid is the p-doped or n-doped section.

Top Contact

If the nanowires have been grown on a substrate in the presence of a catalyst, it is envisaged that some of the nanowires will have a catalyst deposit on top of nanowire. Ideally, the majority of the nanowires will have such a deposit, preferably substantially all the nanowires will comprise this deposit.

In order to create some devices of the invention, the top of the nanowires or nanopyramids needs to comprise a top contact.

In one preferred embodiment, a top contact is formed using another graphitic layer. The invention then involves placing a graphitic layer on top of the formed nanowires or nanopyramids to make a top contact. It is preferred that the graphitic top contact layer is substantially parallel with the substrate layer. It will also be appreciated that the area of the graphitic layer does not need to be the same as the area of the substrate. It may be that a number of graphitic layers are required to form a top contact with a substrate with an array of nanowires or nanopyramids.

The graphitic layers used can be the same as those described in detail above in connection with the substrate. The top contact is graphitic, more especially it is graphene. This graphene top contact should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). It is preferred if the top contact is 20 nm in thickness or less. Even more preferably, the graphitic top contact may be 5 nm or less in thickness.

When graphene contacts directly to the semiconductor nanowires, it usually forms a Schottky contact which hinders the electrical current flow by creating a barrier at the contact junction. Due to this problem, the research on graphene deposited on semiconductors has been mainly confined to the use of graphene/semiconductor Schottky junctions.

However, the inventors have realized that the growing of semiconductor nanowires can involve metal catalysis. In the VLS method, e.g. MBE or MOVPE, the metal catalysts such as Au, Ga, or In are preferably used as seeds for nanowire or nanopyramid growth and they remain as a form of nanoparticles on top of nanowires after completion of the nanowire or nanopyramid growth. These catalyst deposits can be used as an intermediate material between metallic graphene and semiconductor nanowires. By taking advantage of the remaining catalytic material, the Schottky contact formed at the interface between metallic graphitic top contact and the semiconductor nanowire or nanopyramid can be avoided and ohmic contact can be established.

Application of the top contact to the formed nanowires can be achieved by any convenient method. Methods akin to those mentioned previously for transferring graphitic layers to substrate carriers may be used. The graphitic layers from Kish graphite, highly ordered pyrolytic graphite (HOPG), or CVD may be exfoliated by mechanical or chemical methods. Then they can be transferred into etching solutions such as HF or acid solutions to remove Cu (Ni, Pt, etc.) (especially for CVD grown graphitic layers) and any contaminants from the exfoliation process. The etching solution can be further exchanged into other solutions such as deionised water to clean the graphitic layers. The graphitic layers can then be easily transferred onto the formed nanowires as the top contact. Again e-beam resist or photoresist may be used to support the thin graphitic layers during the exfoliation and transfer processes, which can be removed easily after deposition.

It is preferred if the graphitic layers are dried completely after etching and rinsing, before they are transferred to the top of the nanowire or nanopyramid arrays. To enhance the contact between graphitic layers and nanowires a mild pressure and heat can be applied during this "dry" transfer.

Alternatively, the graphitic layers can be transferred on top of the nanowire or nanopyramid arrays, together with a solution (e.g. deionised water). As the solution dries off, the graphitic layers naturally form a close contact to underlying nanowires. In this "wet" transfer method, the surface tension of the solution during the drying process might bend or knock out the nanowire or nanopyramid arrays. To prevent this, where this wet method is used, more robust nanowires are preferably employed. Nanowires having a diameter of >80 nm might be suitable. Alternatively, hole patterned substrates which support the perpendicular nanowire or nanopyramid structure could be used. One may also use the critical-point drying technique to avoid any damage caused by surface tension during the drying process. Another way to prevent this is to use supporting and electrically isolating material as fill-in material between nanowires. The fill-in material needs to be transparent to the emitted or detected light.

If there is a water droplet on a nanowire or nanopyramid array and attempts to remove it involve, for example a nitrogen blow, the water drop will become smaller by evaporation, but the drop will always try to keep a spherical form due to surface tension. This could damage or disrupt the nanostructures around or inside the water droplet.

Critical point drying circumvents this problem. By increasing temperature and pressure, the phase boundary between liquid and gas can be removed and the water can be removed easily.

The top contact graphitic layer is preferably transparent, conductive and flexible. To enhance the electrical and mechanical contact of the graphitic layers to the metal particles on top of as-grown nanowires further, a post-annealing process may be used. After the deposition of the graphitic top contact, the sample can be annealed in an inert atmosphere, e.g. of argon, or vacuum. Temperatures can be up to 600° C. Annealing times can be up to 10 min.

Also doping of the graphitic top contact can be utilized. The major carrier of the graphitic top contact can be controlled as either holes or electrons by doping. It is preferable to have the same doping type in the graphitic top contact and in the semiconducting nanowires, especially at the region below the metal catalytic particles, which would give a better ohmic behaviour after the post-annealing process. For example, for a core-shell nanowire or nanopyramid with p-doping in the shell, p-doping of the top graphitic layers matches the carrier type across the metal particles at the top of the nanowire or nanopyramid shell.

It will be appreciated therefore that both top graphitic layer and the substrate can be doped. In some embodiments, the substrate and/or the graphitic layer is doped by a chemical method which involves with an adsorption of organic or inorganic molecules such as metal chlorides ($FeCl_3$, $AuCl_3$ or $GaCl_3$), $NO_2$, $HNO_3$, aromatic molecules or chemical solutions such as ammonia.

The surface of substrate and/or the graphitic layer could also be doped by a substitutional doping method during its growth with incorporation of dopants such as B, N, S, or Si.

Applications

Semiconductor nanowires or nanopyramids have wide ranging utility. They are semiconductors so can be expected to offer applications in any field where semiconductor technology is useful. They are primarily of use in integrated nanoelectronics and nano-optoelectronic applications.

An ideal device for their deployment might be a solar cell in particular. One possible device is a nanowire or nanopyramid solar cell sandwiched between two graphene layers as the two terminals.

Such a solar cell has the potential to be efficient, cheap and flexible at the same time. This is a rapidly developing field and further applications on these valuable materials will be found in the next years. The same concept can be used to also fabricate other opto-electronic devices such as light-emitting diodes (LEDs), photodetectors, waveguides and lasers.

It will be appreciated that devices of the invention are provided with electrodes to enable charge to be passed into the device.

The invention will now be further discussed in relation to the following non limiting examples and figures.

EXAMPLE 1

Figure 1A:
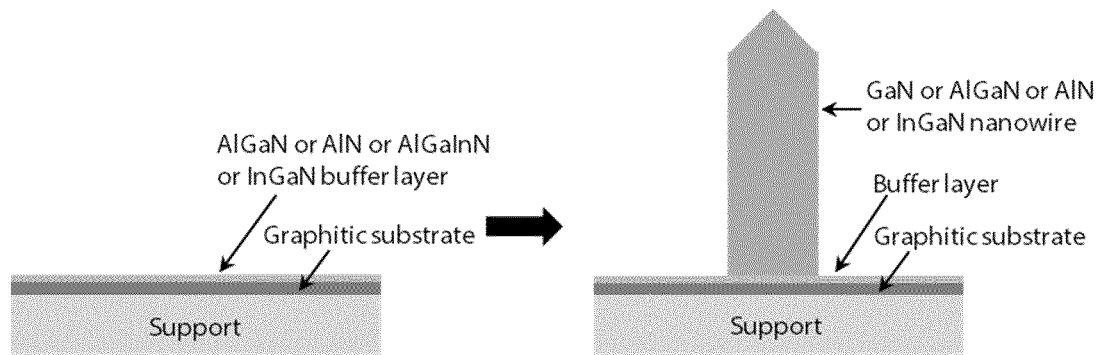
FIG. 1(a) shows a schematic representation of deposition of buffer layer on graphitic substrate, followed by the nanowire growth.
Figure 1B:
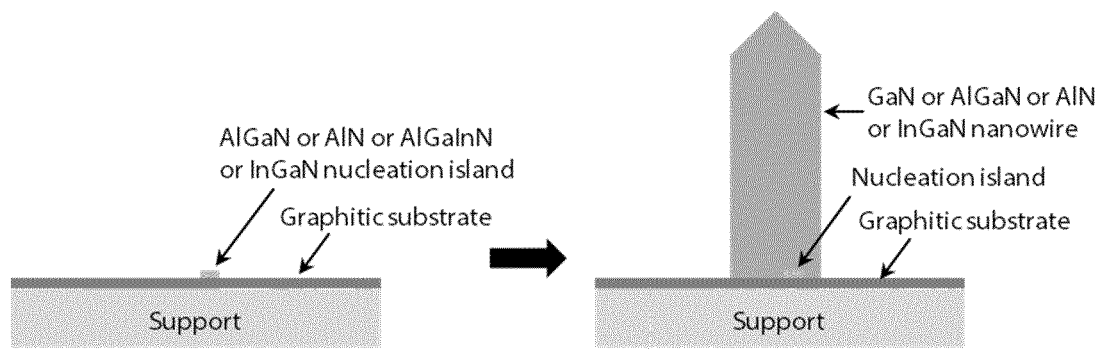
FIG. 1(b) shows a schematic representation of deposition of nucleation islands on graphitic substrate, followed by the nanowire growth.
Figure 2:
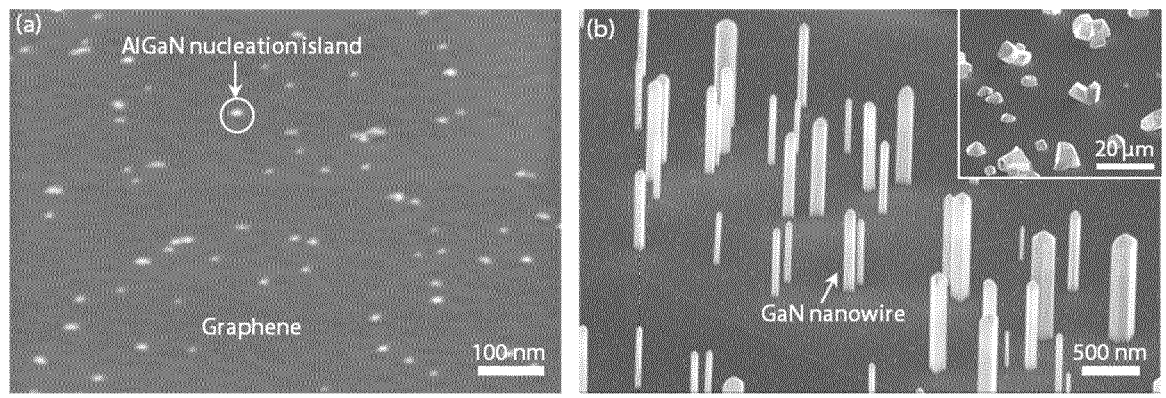
FIG. 2 shows representative results of the formation of nucleation island and nanowire growth scheme. (a) SEM image of AlGaN nucleation islands grown on graphene by MOVPE. (b) SEM image of GaN nanowires grown on the AlGaN nucleation islands on graphene by MOVPE. Inset: SEM image of GaN growth without AlGaN nucleation islands on graphene, where no growth of perpendicular GaN nanowires can be seen.
Figure 3:
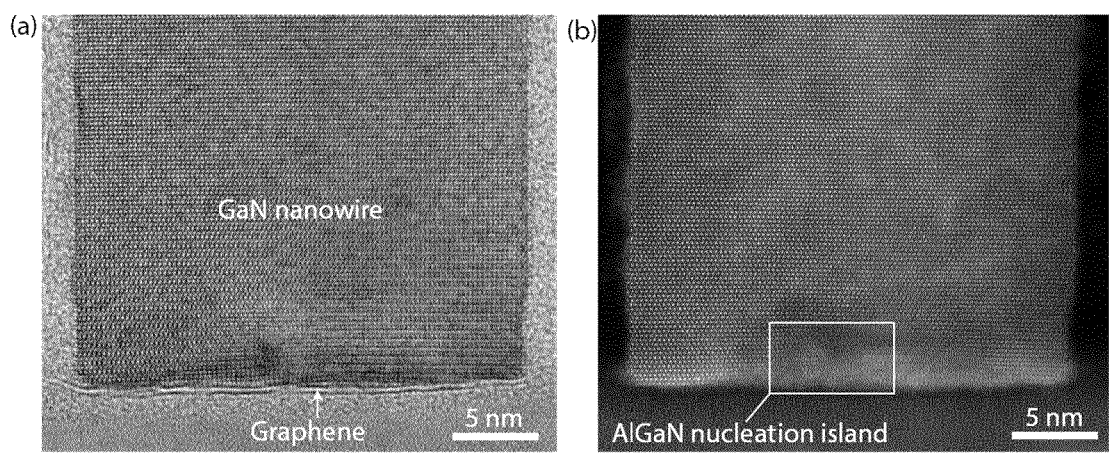
FIG. 3(a) is a cross-sectional high-resolution scanning transmission electron microscope (STEM) image of a GaN nanowire grown on graphene using AlGaN nucleation islands.
FIG. 3(b) is a high-angle annular dark-field STEM image of the same nanowire in (a), showing the AlGaN nucleation island.
Figure 4:
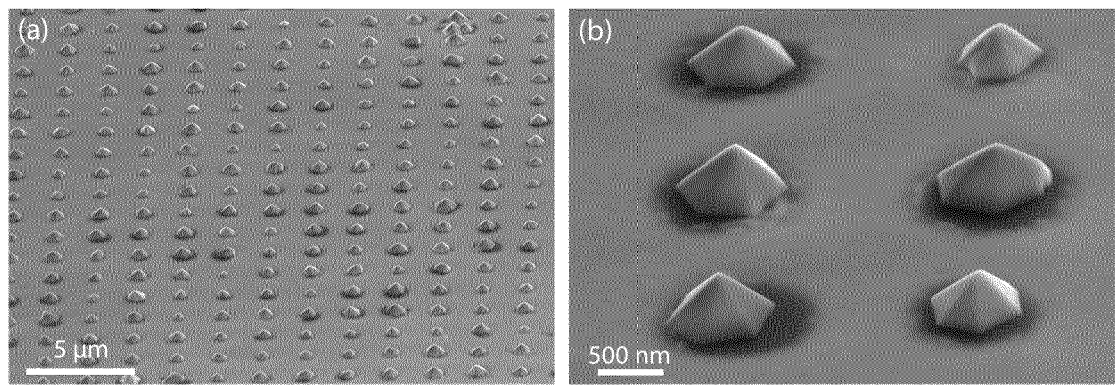
FIG. 4a is a SEM image of (Al)GaN nanopyramids of the invention grown in a regular array. After growing the AlGaN nucleation islands, AlGaN with 3% Al in gas phase was grown for 150 s.
FIG. 4b is a closer image of said nanopyramids.
Figure 5:
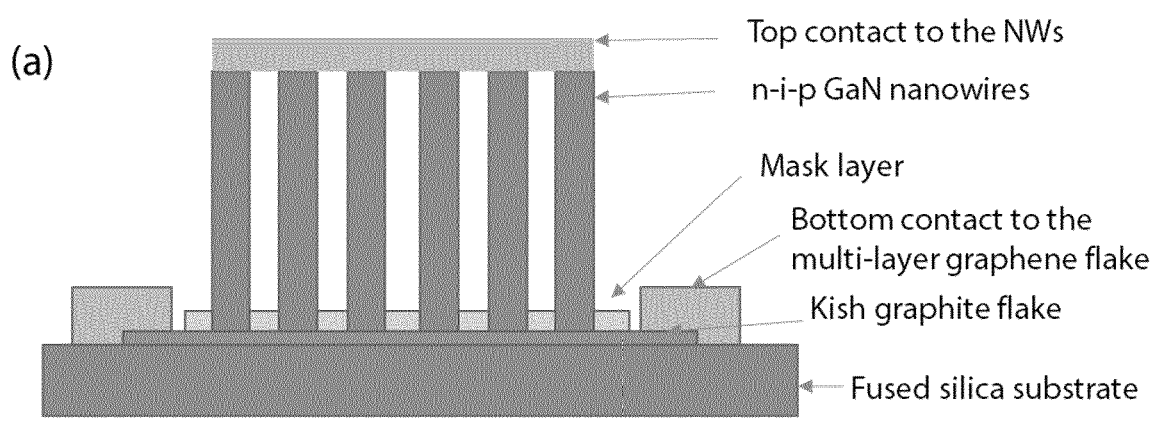
FIG. 5: (a) Schematic diagram showing the growth of nanowires on graphite flake and the top and bottom contacts to the nanowires. Tilted view SEM image (b) and high-resolution SEM image (c) of selectively grown GaN nanowires on multi-layer graphene flakes by MBE.
Figure 5B:
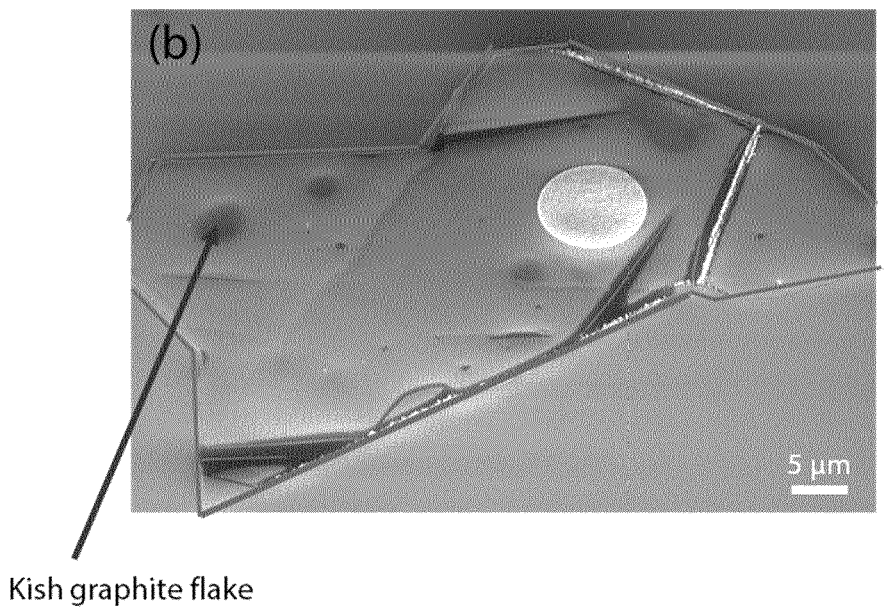
Figure 5C:
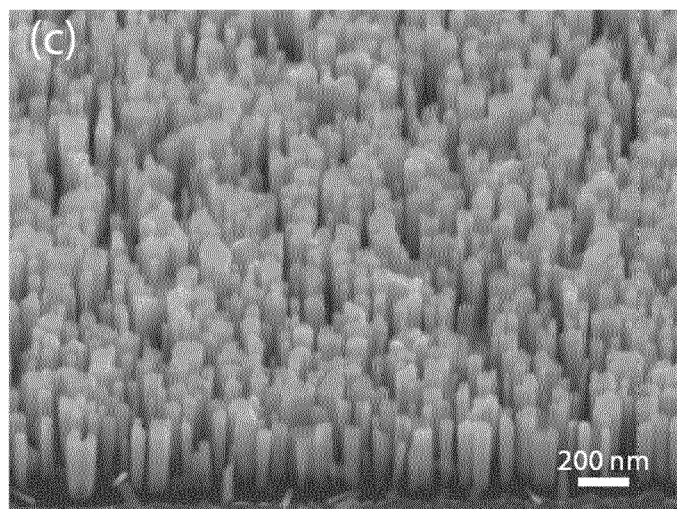

Experimental Procedure of Growing GaN Nanowires on Graphitic Surface Using AlGaN Nucleation Islands:

Commercial CVD-grown graphene on Cu foil, transferred on Si(001), Si(111), and sapphire supporting substrates, were used for this experiment. The growth of GaN nanowires was carried out in a horizontal flow MOVPE reactor (Aixtron 200RF). After loading the sample, the reactor was evacuated and purged with $N_2$ to remove oxygen and water in the reactor. The reactor pressure was set to 75 Torr and $H_2$ was used as the carrier gas for the growth. Subsequently, the substrate was thermally cleaned under $H_2$ atmosphere at a substrate temperature of ~1200° C. for 5 min. After that a nitridation step was carried out using $NH_3$ flow of 600 sccm for 10 min. Subsequently, TMGa and TMAl was introduced for 40 s with a flow of 44.8 and 26.3 µmol/min, respectively, to grow AlGaN nucleation islands, followed by a 2 min nitridation step.

For the growth of GaN nanowires, the substrate temperature was lowered to ~1150° C. and the $NH_3$ flow was set to 25 sccm. When the temperature became stable, Si-doped GaN nanowire growth was carried out for ~3.5 min by introducing TMGa and Silane with a flow of 44.8 and 0.03 µmol/min, respectively. After the growth, the sample was cooled down under $NH_3$ flow of 25 sccm until the temperature dropped below 500° C.

EXAMPLE 2

Experimental Procedure for Nanowires Growth on Nitrogen Plasma Treated Graphitic Surface:

For this experiment multi-layer graphene was mechanically exfoliated from Kish graphite flakes and then indium-bonded to a SiO$_2$/Si supporting substrate. A mask material such as Al$_2$O$_3$ and SiO$_2$ can be optionally deposited on the graphite flake. A big hole of 10 µm in diameter is etched in the mask material using photolithography such that the graphite surface is exposed in the hole. Optionally, several periodically spaced small holes of diameter~100 nm can be etched using e-beam lithography, such that the nanowires selectively grow on the graphitic surface exposed in the hole. The nitrogen plasma treatment and the nanowire growth were carried out in a Veeco Gen 930 MBE system equipped with a nitrogen plasma source, a Ga dual filament cell, and an Al double-crucible cell.

The above samples are then loaded into the MBE system for sample outgassing and nanowire growth. The samples are annealed at a substrate temperature of 550° C. for a duration of 30 min to get rid of any oxide residues and any other contaminants on the substrate. The substrate temperature is then increased to a temperature suitable for GaN nanowire growth: i.e. typically 755° C.

The temperatures of the Ga and Al effusion cell is preset to yield nominal planar growth rate of 0.3 and 0.2 µm per hour, respectively. The nitrogen plasma is generated using a RF generator power of 450 W and nitrogen gas flow of 2.8 sccm. After the sample temperature reaches the growth temperature, the gate valve and the shutter in front of the nitrogen source was opened for 1 min, such that the nitrogen plasma is directed on to the sample. The sample can then either be subjected to the nanowire growth by MBE or taken out of the MBE growth chamber for the nanowire or nanopyramid growth by MOCVD. In the case of nanowire growth by MBE, an Al flux was supplied for 6 seconds or longer and then an Al flux and a nitrogen plasma was supplied for 1 minute or longer. It was followed by the opening of the shutter in front of the Ga and nitrogen source to supply Ga flux and nitrogen plasma simultaneously, to initiate the growth of intrinsic (intentionally undoped) GaN nanowires. Si dopant was supplied to obtain n-type GaN nanowires and either Be or Mg dopant was supplied to obtain p-type GaN nanowires. After the growth, all the shutters are closed and simultaneously the substrate temperate is ramped down.

EXAMPLE 3

Experimental Procedure for the MBE Growth of High-Yield Perpendicular GaAsSb Nanowires on Graphitic Surface Via AlAsSb Nanoscale Islands for Nucleation:

Nanowires are grown in a Varian Gen II Modular MBE system equipped with a Ga dual filament cell, an Al double-crucible cell, an As valved cracker cell, and an Sb valved cracker cell. The cracker cells allow to fix the proportion of monomers, dimers and tetramers. In this example, the major species of arsenic and antimony are As$_2$ and Sb$_2$, respectively.

Growth of NWs is performed either on a Kish graphite flake or on a graphene film grown on SiC substrates by using a high-temperature sublimation technique. The graphene film samples are purchased from external supplier. The Kish graphite samples are cleaned by isopropanol followed by a blow dry with nitrogen, then indium-bonded to a silicon wafer and finally cleaved to provide a fresh graphitic surface for growth of NWs. The graphene/SiC substrates are blow dried with nitrogen, and then indium-bonded to a silicon wafer.

The samples are then loaded into the MBE system for sample outgassing and nanowire growth. The samples are annealed at a substrate temperature of 550° C. for a duration of 30 min to get rid of any oxide residues on the substrate. The substrate temperature is then increased to a temperature suitable for GaAs or GaAsSb nanowire growth: i.e. 630° C.

The temperatures of the Al and Ga effusion cells are preset to yield nominal planar growth rates of 0.1 µm per hour and 0.7 µm per hour, respectively. To form the GaAs(Sb) nanowires, an As$_e$ flux of $2.5 \times 10^{-6}$ Torr is used, whereas the Sb$_2$ flux is set to a value in the range $0$-$1 \times 10^{-6}$ Torr (dependent on the intended GaAsSb composition), for example $6 \times 10^{-7}$ Torr.

Figure 6:
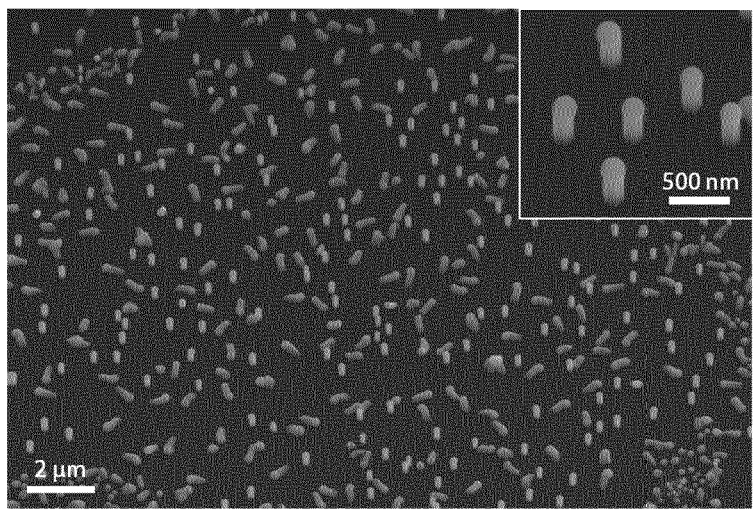
FIG. 6 shows an SEM image of self-catalyzed GaAsSb nanowires grown by MBE using AlAsSb nanoscale islands for enhanced nucleation on pristine graphitic substrate. Inset: Magnified view of the perpendicular GaAsSb nanowires.
Figure 7:
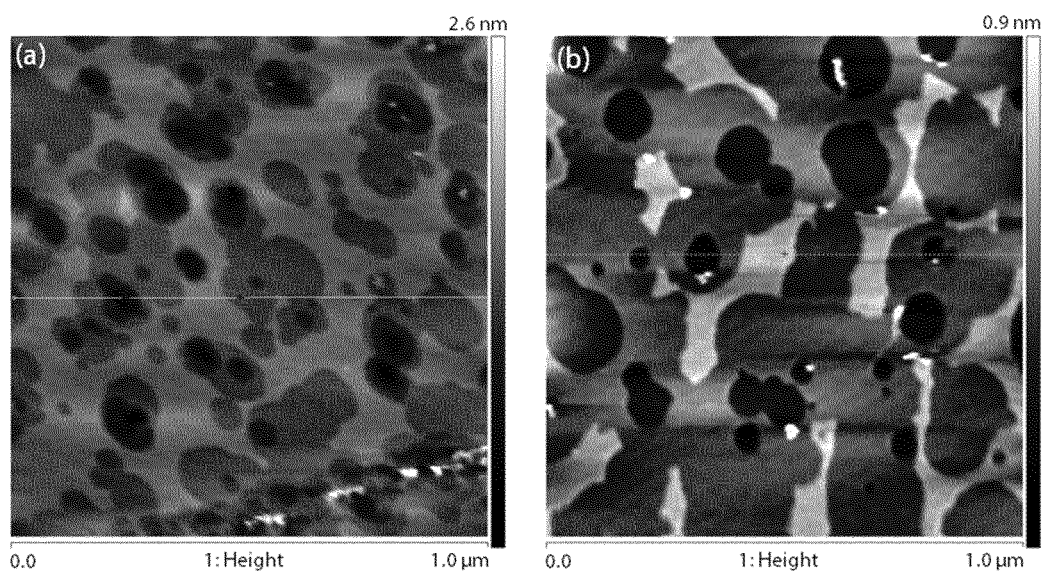
FIG. 7 shows atomic force microscopy (AFM) topography image after the treatment of graphite with (a) UV-ozone and (b) UV-ozone and $H_2$ annealing in Ar atmosphere.
Figure 8:
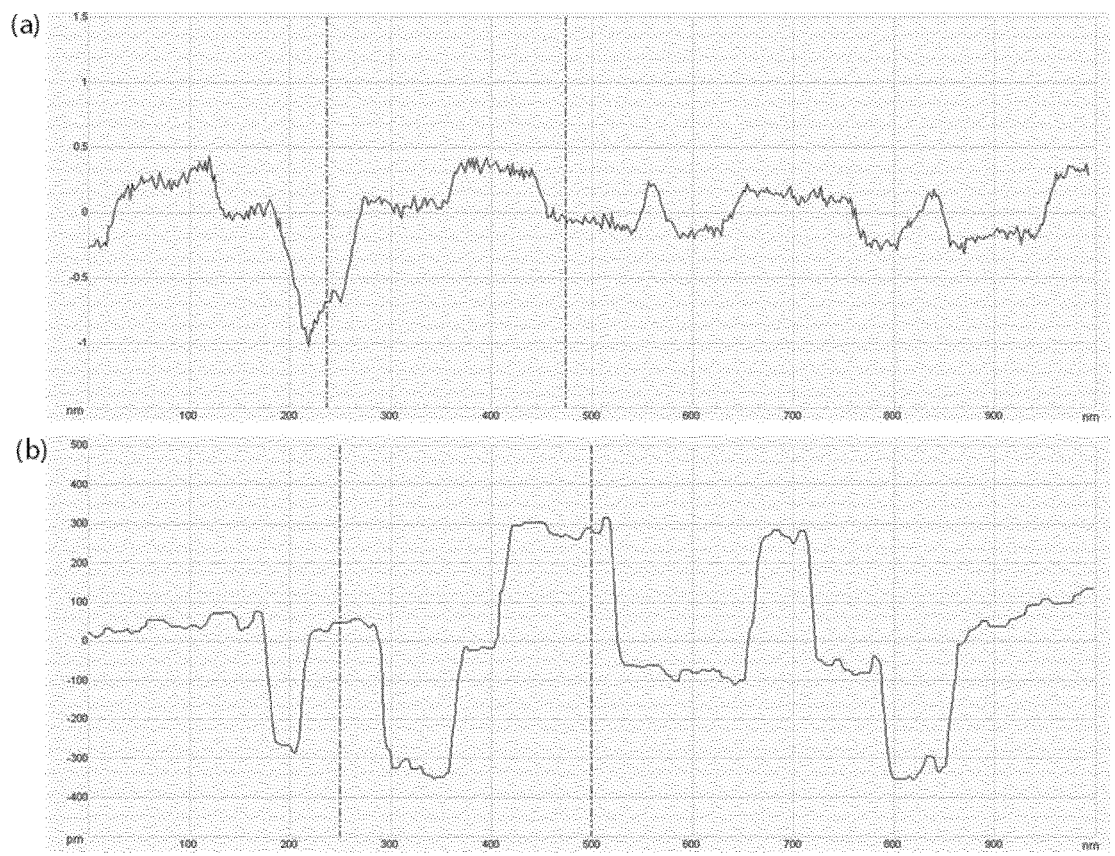
FIG. 8(a) shows the AFM height profile along the solid line in FIG. 6(a) of the graphite surface after the treatment with UV-ozone.
FIG. 8(b) shows the AFM height profile along the dashed line in FIG. 6(b) of the graphite surface after the UV-ozone treatment and the following $H_2$ annealing in Ar atmosphere, showing the formation of atomic steps and ledges. (Nanowires or nanopyramids are then grown on the treated graphitic substrate.)
Figure 9:
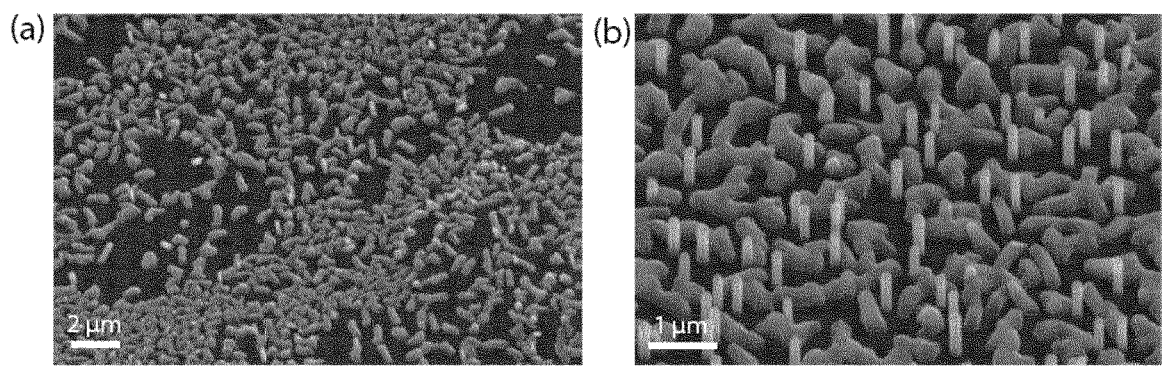
FIG. 9(a) shows an SEM image of GaAsSb nanowires grown on untreated pristine graphitic surface.
FIG. 9(b) shows an SEM image of GaAsSb nanowires grown on UV-ozone treated and $H_2$ annealed graphitic surface. Improved density of perpendicular nanowires can be seen in (b) as compared to (a).
Figure 10:
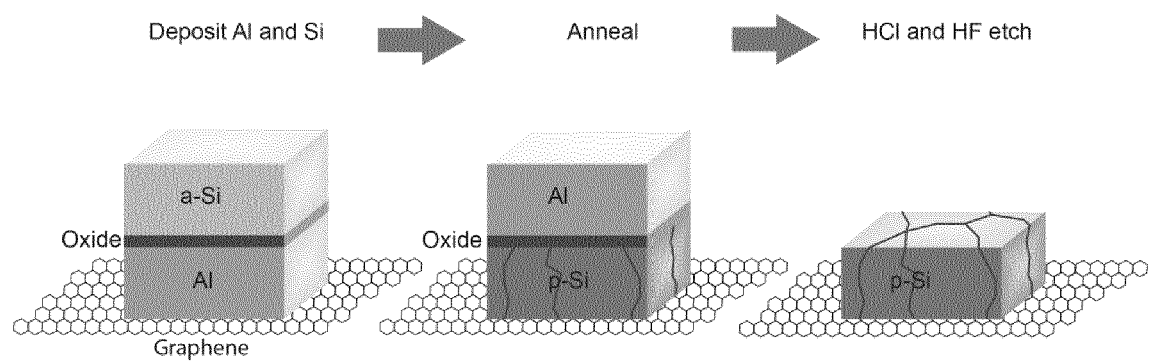
FIG. 10 shows the main process steps of aluminium-induced crystallization (MIC) of silicon on graphene layer 1, where amorphous silicon (a-Si) layer 3 diffuses through an aluminium metal layer 2 by thermal activation. At the graphene-Al interface the silicon rearranges into a polycrystalline structure (p-Si) with [111]-orientation. The aluminium metal layer and the oxide layer above the p-Si structure may be etched using HCl and HF, respectively. (Nanowires or nanopyramids are then grown on the MIC silicon on graphene.)
Figure 11:
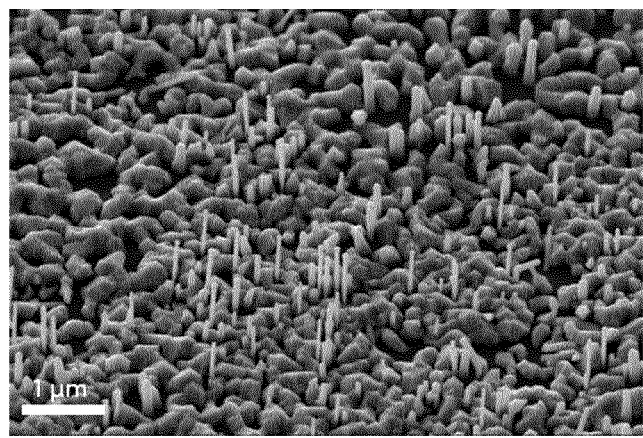
FIG. 11 shows an SEM image of self-catalyzed GaAs nanowires grown by MBE on amorphous ($SiO_2$) substrate covered with MIC silicon.

The Al flux is first supplied to the surface during a time interval of typically 1 s or longer, while the shutters/valves for the other sources are closed. The Al shutter is then closed and As and/or Sb flux are supplied to the surface for a time interval of typically 60 s to form AlAs(Sb) nanoscale islands on the graphitic surface. The group V shutters and valves are then closed and the Ga shutter opened, typically for 5 s, to supply Ga flux to the surface to initiate the formation of Ga droplets at the nanoscale islands. The relevant group V shutters and valves are then opened again to initiate the growth of nanowires. For example, in case of GaAs nanowire growth, only the As shutter and valve are opened at this point, whereas in case of GaAsSb nanowire growth, also the Sb shutter and valve are opened. The duration of the nanowire growth depends on the intended length of the nanowires. In case of the GaAsSb nanowires sample depicted in FIG. 6, the nanowire growth time was 5 min. The growth is stopped by closing all the shutters/valves, and simultaneously ramping down the substrate to room temperature.

EXAMPLE 4

Experimental Procedure for UV-Ozone Treatment and H$_2$ Annealing of the Graphitic Surface, and MBE Growth of Perpendicular GaAs(Sb) Nanowires:

For this experiment Kish graphite flakes were used as the graphitic substrates. The Kish graphite samples are cleaned by isopropanol followed by a blow dry with nitrogen, then indium-bonded to a silicon wafer and finally cleaved to provide a fresh graphitic surface for growth of nanowires. The substrates were treated in UV-ozone at ~150° C. for 6 min, followed by annealing in H$_2$ at ~300° C. for 45 min.

Nanowires are grown in the same MBE system as described in Example 3. The major species of arsenic and antimony are As$_2$ and Sb$_2$, respectively.

The samples are loaded into the MBE system and outgassed at ~550° C. for a duration of 30 min to get rid of any oxide residues on the substrate. The substrate temperature is then increased to a temperature suitable for GaAs or GaAsSb nanowire growth: i.e. 630° C.

The temperatures of the Ga effusion cell is preset to yield nominal planar growth rate of 0.7 µm per hour. To form Ga droplet, Ga flux was supplied for 10 s at a substrate temperature of ~630° C. After that the temperature is reduced to ~250° C. and an Sb$_2$ flux of $8 \times 10^{-7}$ Torr and As$_2$ flux of $2.5 \times 10^{-6}$ Torr are subsequently supplied for 50 s and 40 s, respectively. Then the substrate temperature is again increased to ~630° C. To form the GaAs(Sb) nanowires, Ga flux was supplied for 10 min together with an As$_2$ flux of $2.5 \times 10^{-6}$ Torr, whereas the Sb$_2$ flux is set to a value in the range 0-1×10⁻⁶ Torr (dependent on the intended GaAsSb composition), for example 8×10⁻⁷ Torr. After the growth, all the shutters are closed and simultaneously the substrate temperate is ramped down.

EXAMPLE 5

Experimental Procedure for the Formation of Si(111) by Metal Induced Crystallization (MIC) on Graphene The MIC poly-Si(111) on graphene samples were of commercial chemical vapor deposition (CVD) grown monolayer graphene transferred onto Si(001). On these samples, 50 nm Al was deposited by e-beam evaporation at a rate of 1 Å/s and a pressure of ~10⁻⁸ Torr. The samples were oxidized for 24 h in an ISO5 cleanroom atmosphere before depositing 50 nm amorphous Si (a-Si) by e-beam evaporation at a rate of 1 Å/s and a pressure of ~10⁻⁸ Torr. All depositions were done at room temperature. The samples were annealed for 15 h at 500° C. in a nitrogen gas. After the layer exchange by annealing, the top layer of Al was removed by etching in a phosphoric acid mixture.

The invention claimed is:

1. A process for growing nanowires or nanopyramids comprising:
   (I) providing a graphitic substrate and depositing AlGaN, InGaN, AlN or AlGa(In)N on said graphitic substrate at an elevated temperature to form nanoscale nucleation islands of AlGaN, InGaN, AlN or AlGa(In)N; and
   (II) growing a plurality of semiconducting group III-V nanowires or nanopyramids on the nanoscale nucleation islands on the graphitic substrate, wherein the plurality of semiconducting group III-V nanowires or nanopyramids are grown axially and are therefore formed from a first section and a second section, wherein the first section and the second section are each doped with a different dopant to generate a p-n junction or p-i-n junction.

2. The process as claimed in claim 1, wherein the plurality of semiconducting group III-V nanowires or nanopyramids are grown epitaxially from the nanoscale nucleation islands.

3. The process as claimed in claim 1, wherein said graphitic substrate has a thickness of up to 20 nm.

4. The process as claimed in claim 1, wherein a graphitic top contact layer is present on top of the plurality of semiconducting group III-V nanowires or nanopyramids.

5. The process as claimed in claim 1, wherein the plurality of semiconducting group III-V nanowires or nanopyramids are grown with or without the presence of a catalyst.

6. The process as claimed in claim 1, wherein the plurality of semiconducting group III-V nanowires or nanopyramids are GaN, AlGaN, AlN or InGaN.

7. The process as claimed in claim 1, wherein the plurality of semiconducting group III-V nanowires are grown in the [111] (for cubic crystal structure) or (for hexagonal crystal structure) direction.

8. The process as claimed in claim 1, wherein the plurality of semiconducting group III-V nanowires or nanopyramids comprise a tunnel junction.

9. An electronic device comprising a product obtained by the process as claimed in claim 1, wherein the electronic device comprises a solar cell, photodetector, or LED.

10. The process as claimed in claim 1, wherein the plurality of semiconducting group III-V nanowires or nanopyramids comprise a plurality of group III-nitride nanowires or nanopyramids.

11. The process as claimed in claim 1, wherein the plurality of semiconducting group III-V nanowires or nanopyramids are grown via MOVPE or MBE.

12. A process for growing nanowires or nanopyramids comprising:
   (I) providing a graphitic substrate and depositing AlGaN, InGaN, AlN or AlGa(In)N on said graphitic substrate at an elevated temperature to form nanoscale nucleation islands of AlGaN, InGaN, AlN or AlGa(In)N; and
   (II) growing a plurality of semiconducting group III-V nanowires or nanopyramids on the nanoscale nucleation islands on the graphitic substrate, wherein the plurality of semiconducting group III-V nanowires or nanopyramids comprise an (Al)GaN/Al(Ga)N superlattice.

13. The process as claimed in claim 12, wherein the plurality of semiconducting group III-V nanowires or nanopyramids are grown epitaxially from the nanoscale nucleation islands.

14. The process as claimed in claim 12, wherein said graphitic substrate has a thickness of up to 20 nm.

15. The process as claimed in claim 12, wherein the plurality of semiconducting group III-V nanowires or nanopyramids are doped.

16. The process as claimed in claim 12, wherein the plurality of semiconducting group III-V nanowires or nanopyramids are core-shell nanowires or nanopyramids.

17. The process as claimed in claim 12, wherein a graphitic top contact layer is present on top of the plurality of semiconducting group III-V nanowires or nanopyramids.

18. The process as claimed in claim 12, wherein the plurality of semiconducting group III-V nanowires or nanopyramids are grown with or without the presence of a catalyst.

19. The process as claimed in claim 12, wherein the plurality of semiconducting group III-V nanowires are grown in the [111] (for cubic crystal structure) or (for hexagonal crystal structure) direction.

20. The process as claimed in claim 12, wherein the plurality of semiconducting group III-V nanowires or nanopyramids comprise a tunnel junction.

21. The process as claimed in claim 12, wherein the plurality of semiconducting group III-V nanowires or nanopyramids comprise AlGaN and wherein each of the plurality of semiconducting AlGaN nanowires or nanopyramids has a concentration of Al that increases or decreases along an axial growth direction and/or a radial growth direction of the nanowire or nanopyramid.

22. An electronic device comprising a product obtained by the process as claimed in claim 12, wherein the electronic device comprises a solar cell, photodetector, or LED.

23. The process as claimed in claim 12, wherein the plurality of semiconducting group III-V nanowires or nanopyramids are grown via MOVPE or MBE.

24. A process for growing nanowires or nanopyramids comprising:
   (I) providing a graphitic substrate and depositing AlGaN, InGaN, AlN or AlGa(In)N on said graphitic substrate at an elevated temperature to form nanoscale nucleation islands of AlGaN, InGaN, AlN or AlGa(In)N; and
   (II) growing a plurality of semiconducting group III-V nanowires or nanopyramids on the nanoscale nucleation islands on the graphitic substrate, wherein the plurality of semiconducting group III-V nanowires or nanopyramids comprise AlGaN and wherein each of the plurality of semiconducting AlGaN nanowires or nanopyramids has a concentration of Al that increases or decreases along an axial growth direction and/or a radial growth direction of the nanowire or nanopyramid.

25. The process as claimed in claim 24, wherein the plurality of semiconducting group III-V nanowires or nanopyramids are grown epitaxially from the nanoscale nucleation islands.

26. The process as claimed in claim 24, wherein said graphitic substrate has a thickness of up to 20 nm.

27. The process as claimed in claim 24, wherein the plurality of semiconducting group III-V nanowires or nanopyramids are doped.

28. The process as claimed in claim 24, wherein a graphitic top contact layer is present on top of the plurality of semiconducting group III-V nanowires or nanopyramids.

29. The process as claimed in claim 24, wherein the plurality of semiconducting group III-V nanowires or nanopyramids are grown with or without the presence of a catalyst.

30. The process as claimed in claim 24, wherein the plurality of semiconducting group III-V nanowires are grown in the [111] (for cubic crystal structure) or (for hexagonal crystal structure) direction.

31. The process as claimed in claim 24, wherein the plurality of semiconducting group III-V nanowires or nanopyramids comprise a tunnel junction.

32. An electronic device comprising a product obtained by the process as claimed in claim 24, wherein the electronic device comprises a solar cell, photodetector, or LED.

33. The process as claimed in claim 24, wherein the plurality of semiconducting group III-V nanowires or nanopyramids are grown via MOVPE or MBE.

* * * * *